United States Patent
Rinerson et al.

(10) Patent No.: US 7,897,951 B2
(45) Date of Patent: *Mar. 1, 2011

(54) CONTINUOUS PLANE OF THIN-FILM MATERIALS FOR A TWO-TERMINAL CROSS-POINT MEMORY

(75) Inventors: Darrell Rinerson, Cupertino, CA (US); Jonathan Bornstein, Cupertino, CA (US); Robin Cheung, Cupertino, CA (US); David Hansen, Palo Alto, CA (US); Travis Byonghyop Oh, San Jose, CA (US)

(73) Assignee: Unity Semiconductor Corporation

( * ) Notice: Subject to any disclaimer, the term of this patent is extended or adjusted under 35 U.S.C. 154(b) by 760 days.

This patent is subject to a terminal disclaimer.

(21) Appl. No.: 11/881,496

(22) Filed: Jul. 26, 2007

(65) Prior Publication Data

US 2009/0026442 A1 Jan. 29, 2009

(51) Int. Cl.
*H01L 29/02* (2006.01)
*H01L 29/06* (2006.01)

(52) U.S. Cl. ..................... 257/2; 257/4; 257/5

(58) Field of Classification Search ............ 257/295, 257/E27.006, 2–5, E21.663, E21.665, E31.047, 257/E29.077
See application file for complete search history.

(56) References Cited

U.S. PATENT DOCUMENTS

| 6,034,882 | A | 3/2000 | Johnson et al. |
| 6,965,137 | B2 | 11/2005 | Kinney et al. |
| 7,460,385 | B2 | 12/2008 | Gruber et al. |
| 7,742,323 | B2 * | 6/2010 | Rinerson et al. ............. 365/129 |
| 2003/0151959 | A1 | 8/2003 | Tringall et al. |
| 2007/0105390 | A1 | 5/2007 | Oh |

OTHER PUBLICATIONS

U.S. Appl. No. 11/881,474, filed Jul. 26, 2007, Cheung et al.
U.S. Appl. No. 12/075,017, filed Mar. 7, 2008, Schloss.
U.S. Appl. No. 11/881,473, filed Jul. 26, 2007, Brewer et al.

* cited by examiner

*Primary Examiner* — Hung Vu

(57) ABSTRACT

A structure for a memory device including a plurality of substantially planar thin-film layers or a plurality of conformal thin-film layers is disclosed. The thin-film layers form a memory element that is electrically in series with first and second cladded conductors and operative to store data as a plurality of conductivity profiles. A select voltage applied across the first and second cladded conductors is operative to perform data operations on the memory device. The memory device may optionally include a non-ohmic device electrically in series with the memory element and the first and second cladded conductors. Fabrication of the memory device does not require the plurality of thin-film layers be etched in order to form the memory element. The memory element can include a CMO layer having a selectively crystallized polycrystalline portion and an amorphous portion. The cladded conductors can include a core material made from copper.

14 Claims, 16 Drawing Sheets

CONTINUOUS PLANE OF THIN-FILM MATERIALS FOR A TWO-TERMINAL CROSS-POINT MEMORY

FIELD OF THE INVENTION

The present invention relates generally to electronic circuits. More specifically, the present invention relates to microelectronics fabrication techniques.

Figure 1A:
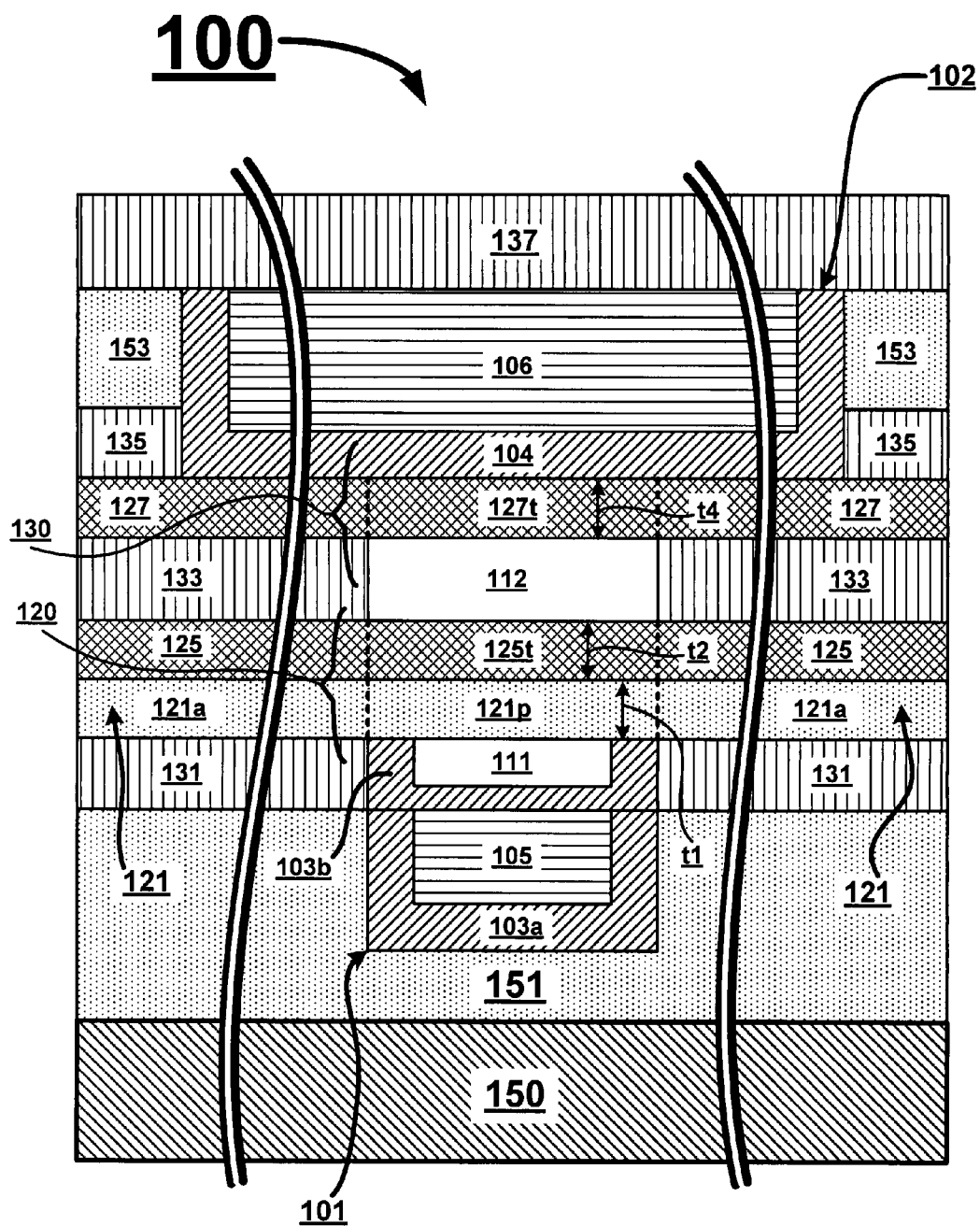
FIG. 1A is a cross-sectional view depicting a structure for a first exemplary memory device.

Although the previous Drawings depict various examples of the invention, the invention is not limited by the depicted examples. Furthermore, the depictions are not necessarily to scale.

DETAILED DESCRIPTION

In the following detailed description and in the several figures of the Drawings, like elements are identified with like reference numerals.

As depicted in the Drawings for purpose of illustration, the present invention discloses a structure for a two-terminal non-volatile memory device. The memory device includes a memory element operative to store data as a plurality of conductivity profiles that can be determined by applying a read voltage across the two terminals of the memory device. Stored data is retained in the memory element in the absence of power such that the memory device is non-volatile. Data can be written to the memory device by applying a write voltage of appropriate magnitude and/or polarity across the two terminals. The memory device can be one of a plurality of memory devices configured into a cross-point memory array that is fabricated over a substrate (e.g, a silicon Si wafer) that includes circuitry electrically coupled with the cross-point array and operative to perform data operations (e.g., read and write operations) to the cross-point array. Examples of the circuitry include but are not limited to address decoders, sense amplifiers, drivers for applying the read and write voltages, multiplexers, buffers, and registers, just to name a few. An optional non-ohmic device can be included in the memory device and connected electrically in series with the memory element and the two terminals.

Reference is now made to FIG. 1A where a memory device 100 includes a first cladded conductor 101, a second cladded conductor 102, a memory element 120, and a non-ohmic device 130. The first cladded conductor 101 includes a first core conductor 105 and a first outer cladding (103a, 103b) that is in contact with and completely surrounds the first core conductor 105. The first outer cladding has two sections, 103a and 103b, resulting from an order in which the memory device 100 is fabricated. During fabrication of the first cladded conductor 101, the section 103a is fabricated first, followed by the first core conductor 105, and then the section 103b is fabricated so that the first outer cladding (103a, 103b) completely surrounds the first core conductor 105. A first electrode 111 is electrically coupled with the first cladded conductor 101 and is inlaid in a portion of the section 103b. The first electrode 111 includes a substantially planar surface that is not in contact with the first outer cladding (i.e., the section 103b).

The memory device 100 can be fabricated over a substrate 150 that includes circuitry (not shown) that is electrically coupled with the memory device 100. For example, an interconnect structure (not shown) can be used to electrically communicate signals between the memory device 100 and the circuitry in the substrate 150. As part of the fabrication of the memory device 100, a layer of a dielectric material 151 (e.g., silicon oxide $SiO_2$) can be formed over the substrate 150, planarized, patterned and etch to form a trench in which the materials for the first cladded conductor 101 (e.g., 103a and 105) are deposited. After the deposition, the materials can be planarized to form a substantially planar surface upon which to deposit another layer of dielectric material 131 (e.g., silicon nitride $SiN_x$). The layer 131 can then be patterned and etched to form a trench in which the material for the section 103b is deposited followed by the deposition of the first electrode 111. A subsequent planarization step can be used form the substantially planar surface for the first electrode 111 and to form a substantially planar surface along the materials 131 and 103b. The aforementioned substantially planar surfaces are necessary for a subsequent deposition of a plurality of thin-film layers of material that will form a memory element, and optionally, a non-ohmic device. Planarization can be accomplished using fabrication techniques that are well know in the microelectronics art, such as, chemical mechanical planarization (CMP), for example.

The memory element 120 is operative to store data as a plurality of conductivity profiles. The memory element 120 includes a plurality of substantially planar thin-film layers. Each thin-film layer is a continuous layer of a substantially planar material such that a plurality of the memory elements 120 can be formed in the plurality of substantially planar thin-film layers, with each memory element 120 belonging to a specific memory device 100. The plurality of substantially planar thin-film layers includes a layer 121 of a conductive metal oxide (CMO) and a layer 125 of a first electrically insulating material. The CMO 121 includes a selectively crystallized portion 121p that is in contact with the substantially planar surface of the first electrode 111 and has a polycrystalline structure. The CMO 121 also includes an amorphous portion 121a that is not in contact with the substantially planar surface of the first electrode 111 and having an amorphous structure. The dashed lines in the layer 121 depict an approximate demarcation between the selectively crystallized portion 121p and the amorphous portions 121a. The layer 125 of the first electrically insulating material includes a first tunnel barrier 125t that is in contact with the selectively crystallized portion 121p of the CMO 121. Although the entire layer 125 is made from the first electrically insulating material, the portion of the layer 125 that is proximate to and in contact with the selectively crystallized portion 121p is operative as a tunnel barrier as depicted by the dashed lines in the layer 125 which depict an approximate demarcation for the first tunnel barrier 125t. A second electrode 112 having a substantially planar surface is in contact with the first tunnel barrier 125t. The second electrode 112 is not in contact with the entire layer 125 of the first electrically insulating material and has sidewall surfaces that are surrounded by a substantially planar dielectric material (e.g., silicon nitride $SiN_x$).

The memory device 100 also includes a second cladded conductor 102 and a non-ohmic device 130. The second cladded conductor 102 includes a second core conductor 106 and a second outer cladding 104 that is in contact with and partially surrounds the second core conductor 106. The non-ohmic device 130 includes a substantially planar layer of a second electrically insulating material 127. The second electrically insulating material 127 includes a second tunnel barrier 127t that is in contact with the substantially planar surface of the second electrode 112. The second tunnel barrier 127t is also in contact with a portion of the second outer cladding 104 of the second cladded conductor 102. Accordingly, the portion of the second outer cladding 104, the second tunnel barrier 127t, and the second electrode 112 form a non-ohmic device 130 having a metal-insulator-metal (MIM) structure. Although the entire layer 127 is made from the second electrically insulating material, the portion of the layer 127 that is proximate to and in contact with the second electrode 112 is operative as a tunnel barrier as depicted by the dashed lines in the layer 127 which depict an approximate demarcation for the second tunnel barrier 127t.

The second cladded conductor 102 can be formed in a manner similar to that of the first cladded conductor 101. For example, substantially planar dielectric materials 135 (e.g., silicon nitride $SiN_x$) and 153 (e.g., silicon oxide $SiO_2$) can be patterned and etched to form a trench in which the material for the second outer cladding 104 is deposited, followed by a deposition of the material for the second core conductor 106. The materials can then be planarized (e.g., using CMP) to form a substantially planar upper surface upon which a subsequent dielectric material 137 (e.g., silicon nitride $SiN_x$) can be deposited and then planarized.

The memory element 120 includes the first electrode 111 and the second electrode 112, which is common to both the memory element 120 and the non-ohmic device 130. The memory element 120 and the non-ohmic device 130 are electrically in series with each other and with the first and second cladded conductors 101 and 102.

Figure 1B:
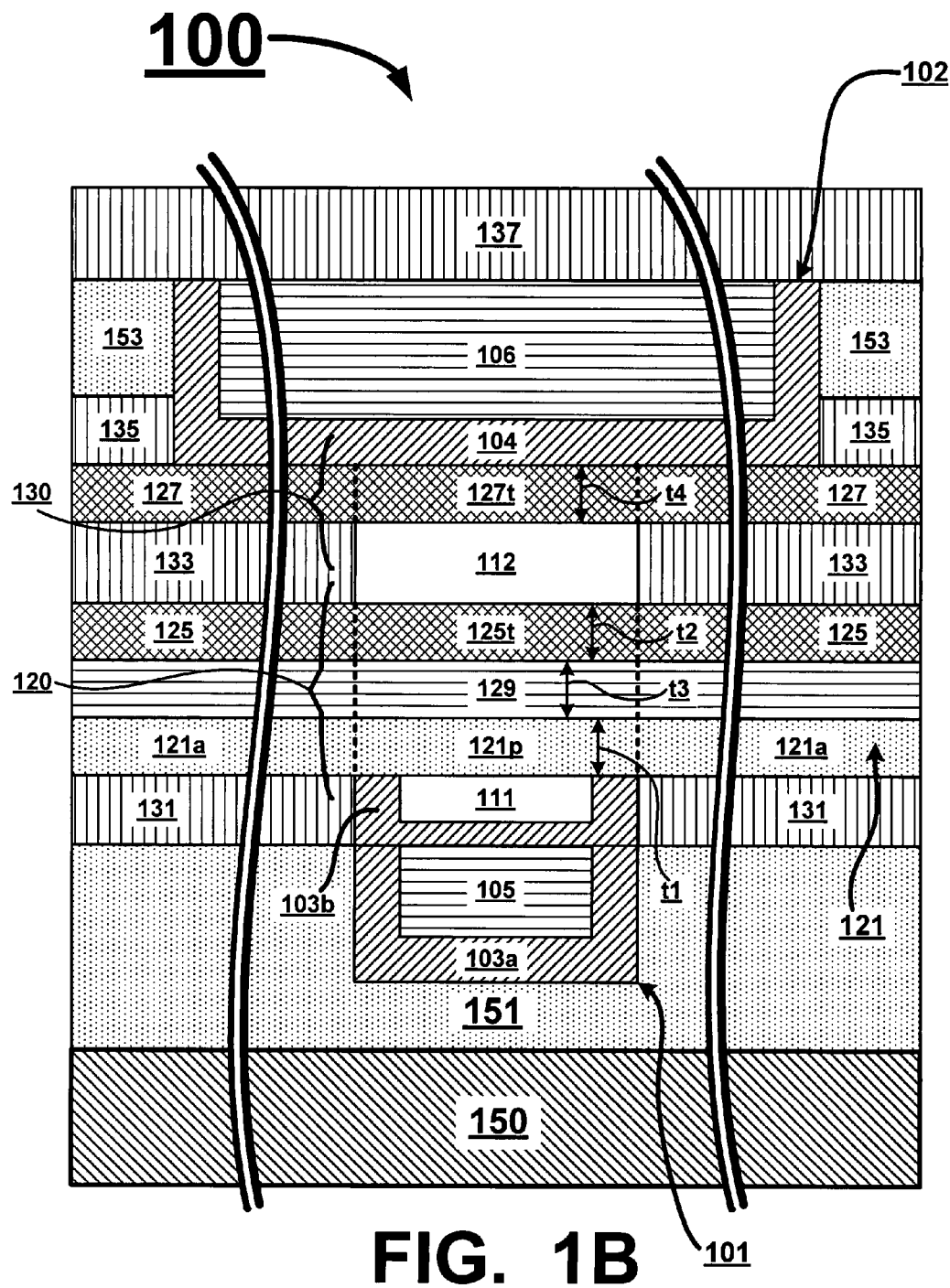
FIG. 1B is a cross-sectional view depicting a structure for a second exemplary memory device.

Turning now to FIG. 1B, the plurality of substantially planar thin-film layers in the memory element 120 can optionally include an ion barrier layer 129. The ion barrier layer 129 is positioned between the CMO layer 121 and the layer 125 of the first electrically insulating material and is in contact with the CMO 121 and the layer 125 of the first electrically insulating material. The ion barrier layer 129 is a barrier to mobile oxygen (O) ions and is operative to improve data retention in the memory element 120.

Figure 1C:
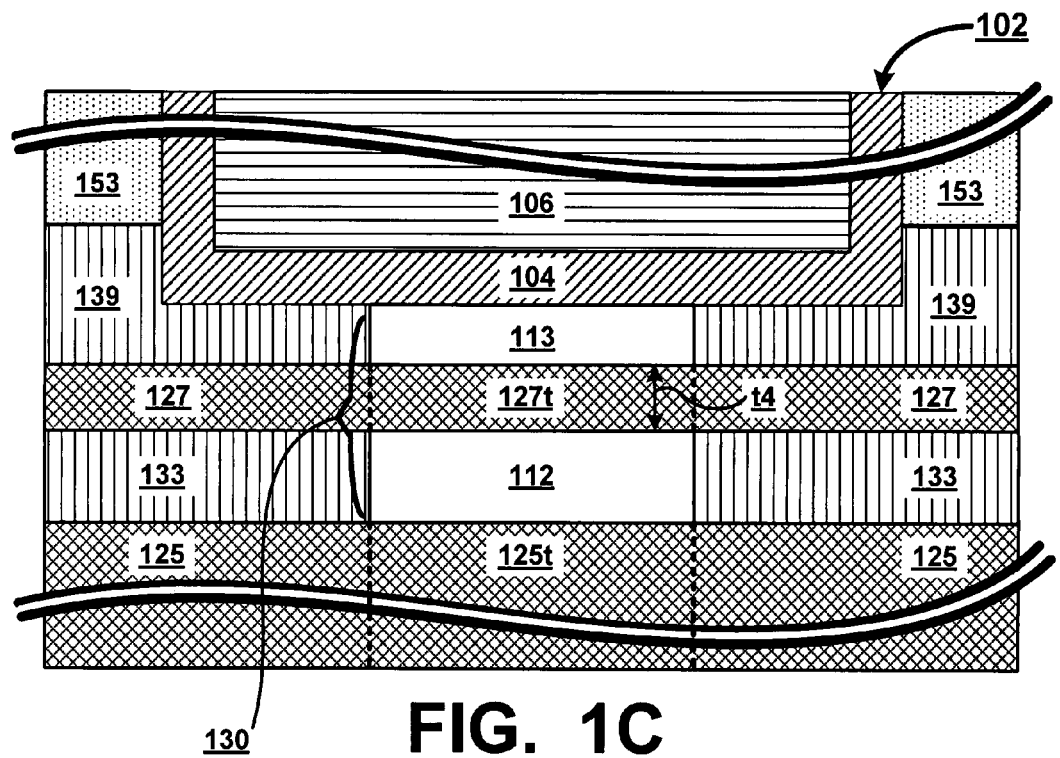
FIG. 1C is a cross-sectional view depicting an alternative structure for a non-ohmic device for the memory devices depicted in FIGS. 1A and 1B.

Reference is now made to FIG. 1C, where an alternative configuration for the electrodes in the non-ohmic device 130 is depicted. The layers below the layer 125 of the first electrically insulating material are identical to those depicted in FIGS. 1A and 1B. The non-ohmic device 130 includes a third electrode 113 that is in contact with the second tunnel barrier 127t and in contact with a portion of the second outer cladding 104. The third electrode 113 is positioned between the second tunnel barrier 127t and the second outer cladding 104 such that the second tunnel barrier 127t is not in contact with the second outer cladding 104, unlike the configuration depicted in FIGS. 1A and 1B. Sidewall surfaces of the third electrode 113 are surrounded by a dielectric material 139 (e.g., nitride $SiN_x$). The dielectric material 139 may also cover a portion of the sidewall surfaces of the second outer cladding 104.

Figure 1D:
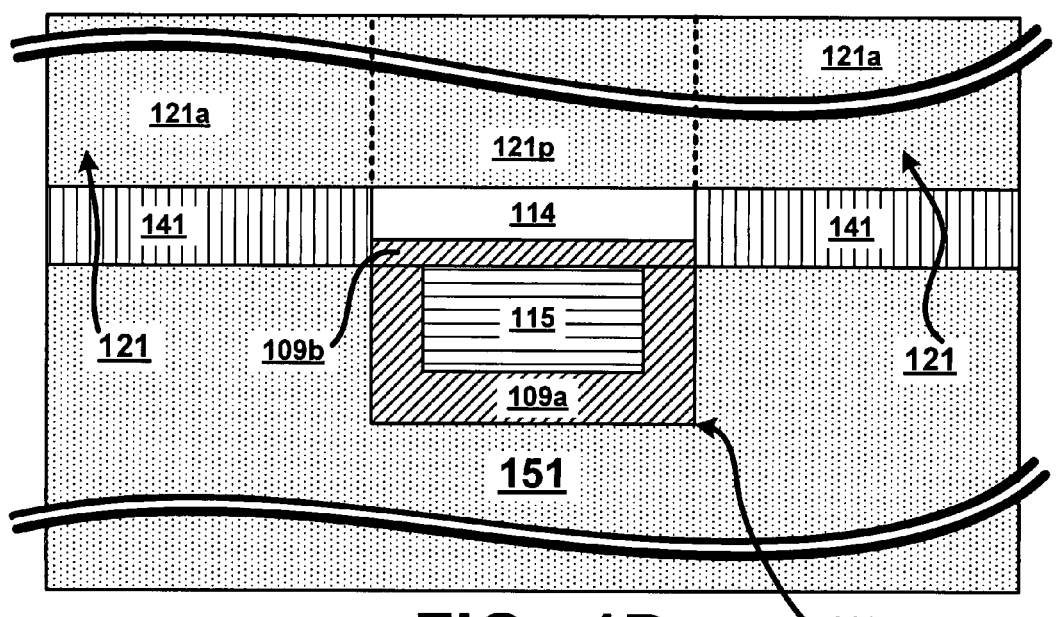
FIG. 1D is a cross-sectional view depicting an alternative structure for a cladded conductor and an electrode for the memory devices depicted in FIGS. 1A and 1B.

In FIG. 1D, an alternative configuration for the first cladded conductor and the first electrode is depicted. The layers above the CMO layer 121 are identical to those depicted in FIGS. 1A, 1B, and 1C. The first cladded conductor 110 includes a first core conductor 115 and a first outer cladding having two sections, 109a and 109b, that are in contact with and completely surround the first core conductor 115. A first electrode 114 is in contact with a substantially planar portion of the first outer cladding (i.e., the section 109b) and the first electrode 114 includes a substantially planar surface upon which subsequent thin-film layers will be deposited. Sidewall surfaces of the section 109b and the first electrode 114 are covered by a dielectric material 141 (e.g., silicon nitride $SiN_x$). The selectively crystallized portion 121p is in contact with the substantially planar surface of the first electrode 114 and the dashed lines in the CMO 121 depict an approximate demarcation between the amorphous portions 121a and the polycrystalline portion 121p.

Figure 2A:
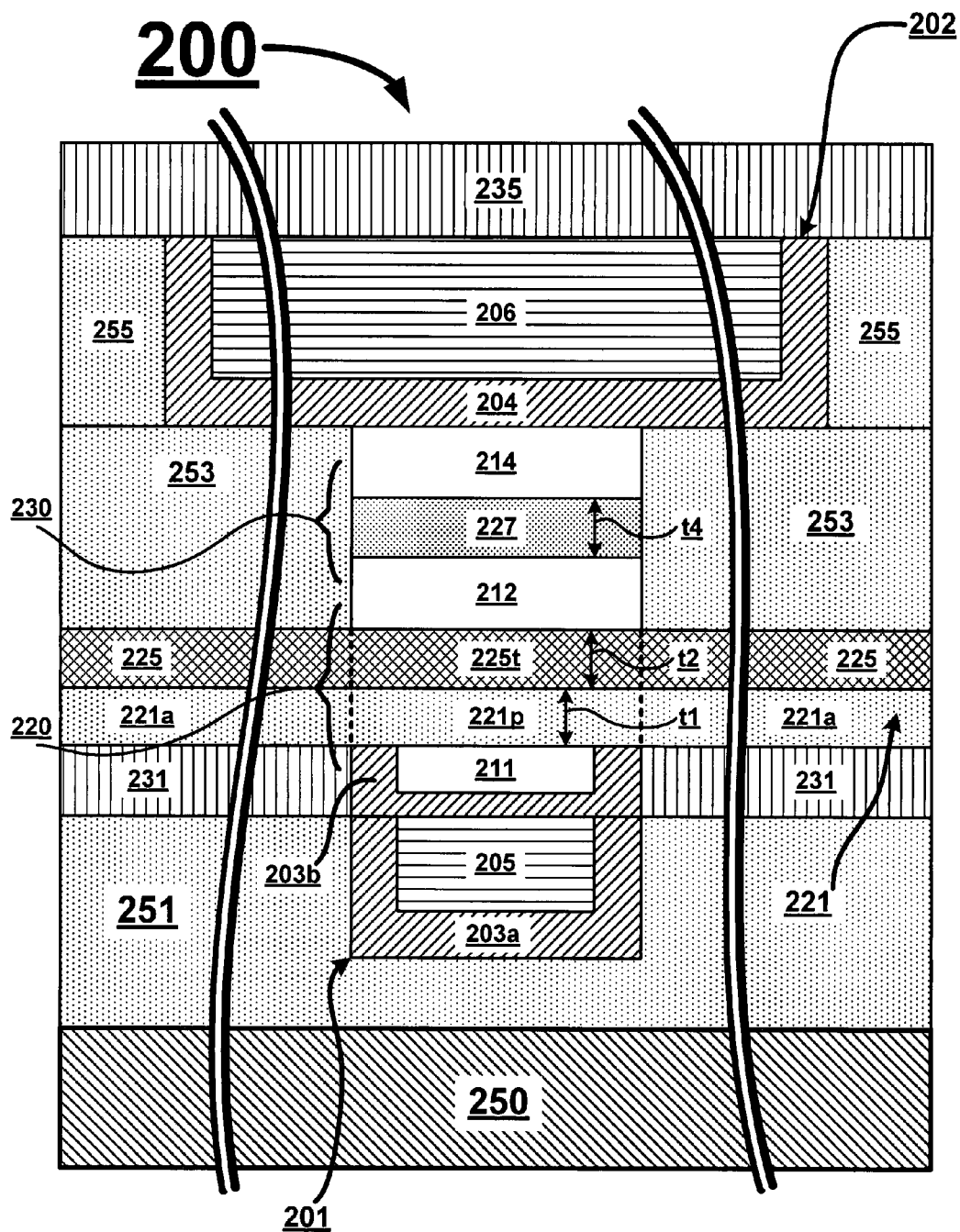
FIG. 2A is a cross-sectional view depicting a structure for a third exemplary memory device.

Reference is now made to FIG. 2A, where a memory device 200 includes a first cladded conductor 201, a second cladded conductor 202, a memory element 220, and a non-ohmic device 230. The first cladded conductor 201 includes a first core conductor 205 and a first outer cladding (203a, 203b) that completely surrounds and is in contact with the first core conductor 205. A first electrode 211 is in contact with the first cladded conductor and is inlaid in a portion 203b of the first outer cladding 201 as was described above in reference to FIG. 1A. The first electrode 211 includes a substantially planar surface that is not in contact with the first outer cladding (i.e., 203b). The memory element 220 includes a plurality of substantially planar thin-film layers including a CMO layer 221 that includes a substantially crystallized portion 221p having a polycrystalline structure and an amorphous portion 221a having an amorphous structure. A layer of a first electrically insulating material 225 is in contact with the CMO layer 221 and includes a first tunnel barrier 225t in contact with the selectively crystallized portion 221p. As described above, the dashed lines in layers 221 and 225 depict an approximate demarcation for the selectively crystallized portion 221p and the first tunnel barrier 225t, respectively. The second cladded conductor 202 includes a second core conductor 206 that is partially surrounded by a second outer cladding 204. The non-ohmic device 230 includes a second tunnel barrier 227 that is made from a second electrically insulating material. The second tunnel barrier 227 is in contact with a third electrode 214 that is in contact with a portion of the second outer cladding 204. The second tunnel barrier 227 is in contact with the second electrode 212 and shares the second electrode 212 with the first tunnel barrier 225t. The memory element 220 and the non-ohmic device 230 are electrically in series with each other and electrically in series with the first and second cladded conductors 201 and 202.

Figure 2B:
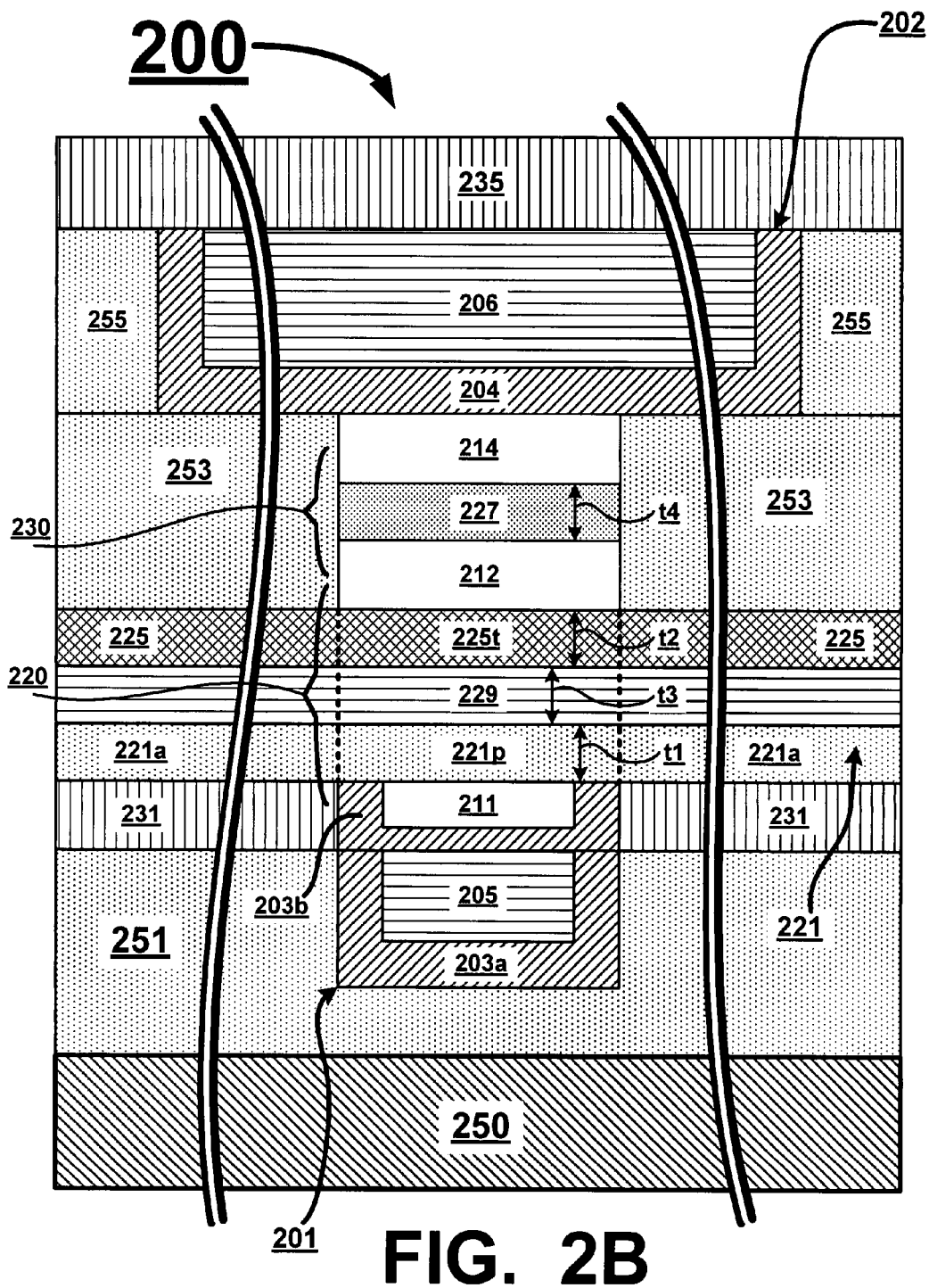
FIG. 2B is a cross-sectional view depicting a structure for a fourth exemplary memory device.

Turning now to FIG. 2B, the plurality of substantially planar thin-film layers can optionally include an ion barrier layer 229 as was described above in reference to FIG. 1B. The ion barrier layer 229 is positioned between and in contact with the CMO layer 221 and the layer 225 of the first electrically insulating material.

In the examples depicted in FIGS. 2A and 2B, the second tunnel barrier 227 is a discrete thin-film layer that includes substantially planar opposed surfaces. However, unlike the examples depicted in FIGS. 1A through 1D where the layer 127 of the second electrically insulating material spans across a plurality of memory devices 100 to form a plurality of second tunnel barriers 127t at the juncture of electrodes (112, 104, 113), each second tunnel barrier 227 depicted in FIGS. 2A and 2B, is a discrete layer that is dedicated to a specific non-ohmic device 230 of a single memory device 200.

Figure 2C:
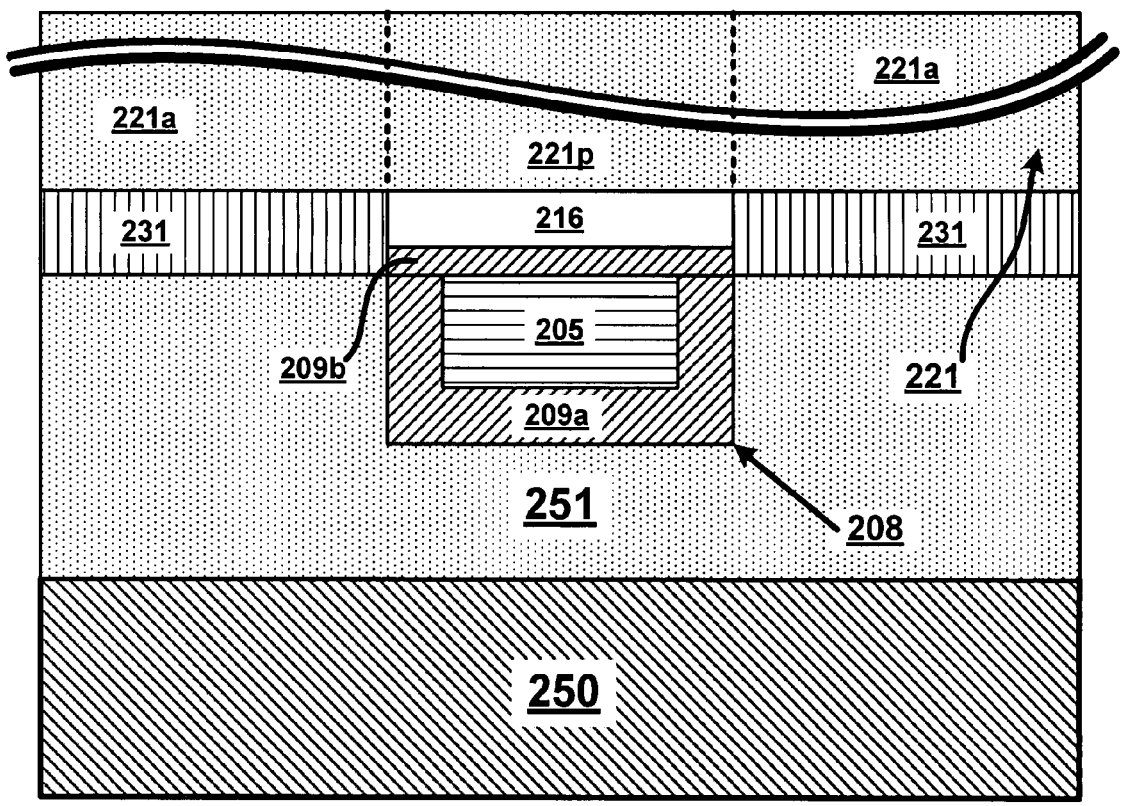
FIG. 2C is a cross-sectional view depicting an alternative structure for a cladded conductor and an electrode for the memory devices depicted in FIGS. 2A and 2B.

Referring to FIG. 2C, an alternative configuration for the first cladded conductor is depicted. The layers above the CMO layer 221 are identical to those depicted in FIGS. 2A and 2B. A first cladded conductor 208 includes a first core conductor 205 and a first outer cladding (209a, 209b) that is in contact with and completely surrounds the first core conductor 205. A first electrode 216 is in contact with a portion 209b of the first outer cladding and includes a substantially planar surface that is in contact with the selectively crystallized portion 221p of the CMO layer 221. The CMO layer 221 also includes the amorphous portions 221a. The memory element 220 (not shown) may include the optional ion barrier layer 229 as depicted in FIG. 2B.

In the examples depicted in FIGS. 2A through 2C, the memory device 200 may be fabricated over a substrate 250 that includes circuitry that is electrically coupled with the memory device 200. The first and second cladded conductors 201 and 202 can be formed in a dielectric material 251 and 255, respectively (e.g., silicon oxide $SiO_2$). Similarly, a dielectric material (e.g., silicon nitride $SiN_x$) can be used for layers 231, 253, and 235.

Figure 3A:
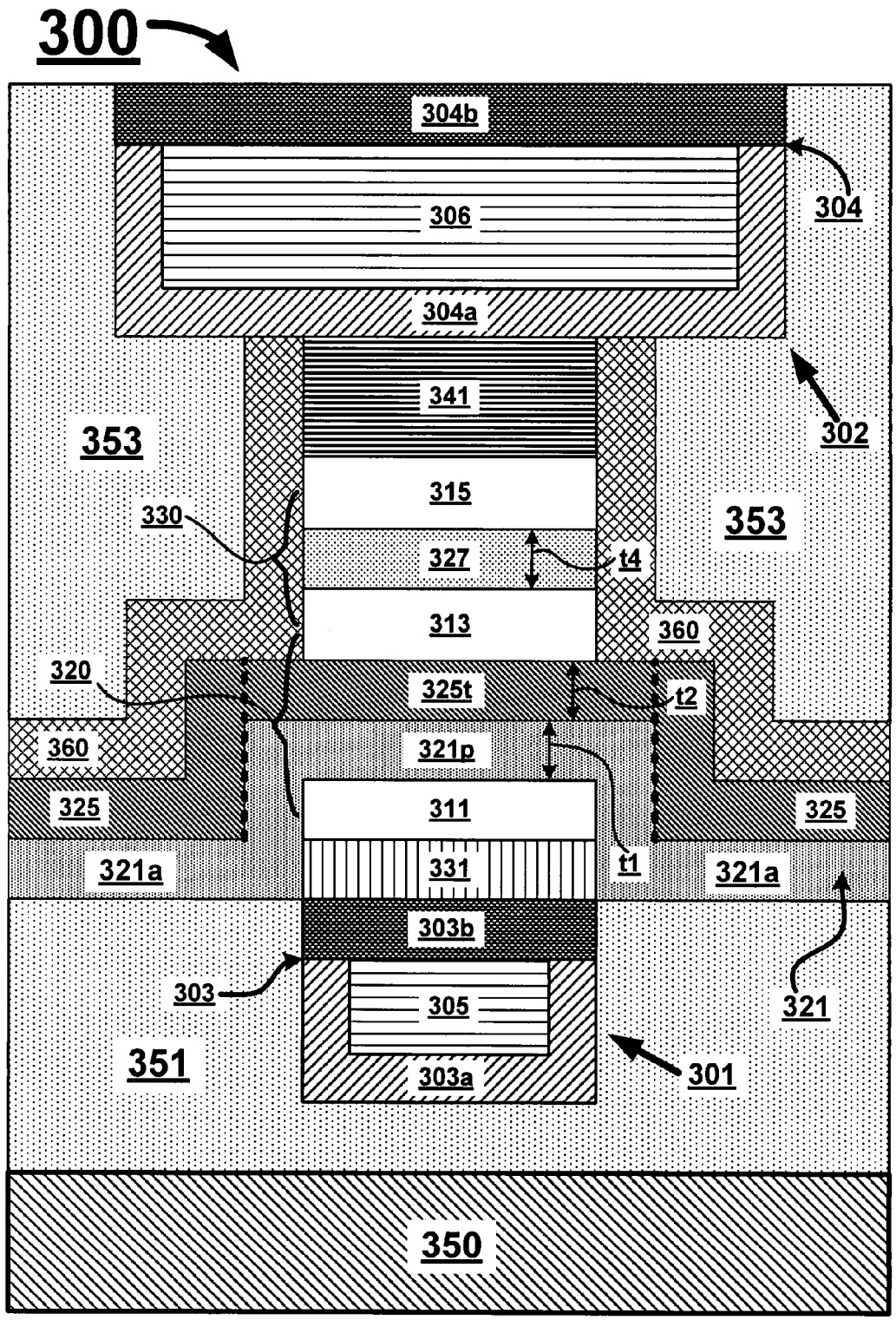
FIG. 3A is a cross-sectional view depicting a structure for a fifth exemplary memory device.

Turning now to FIG. 3A, a memory device 300 includes a first cladded conductor 301, a second cladded conductor 302, a memory element 320, and a non-ohmic device 330. The memory element 320 and the non-ohmic device 330 are electrically in series with each other and with the first and second cladded conductors 301 and 302. The first cladded conductor 301 includes a first core conductor 305 and a first composite cladding 303 that is in contact with and completely surrounds the first core conductor 305. The first composite cladding 303 includes a first material 303a and a second material 303b. A first electrically conductive adhesion layer 331 is in contact with the second material 303b. A first electrode 311 is in contact with the first adhesion layer 331. The second material 303b, the first adhesion layer 331, and the first electrode 311 include substantially planar surfaces. The first adhesion layer 331 is operative to promote adhesion between the second material 303b and the first electrode 311, particularly when the material for the first electrode 311 is a noble metal, such as platinum (Pt), for example.

The memory element 320 includes a plurality of conformal thin-film layers including a conformal layer 321 of CMO and a conformal layer 325 of a first electrically insulating material in contact with the CMO layer 321. The CMO 321 includes a selectively crystallized portion 321p in contact with the substantially planar surface of the first electrode 311 and having a polycrystalline structure and an amorphous portion 321a having an amorphous structure. The conformal layer 325 includes a first tunnel barrier 325t in contact with the selectively crystallized portion 321p. The dashed lines in conformal layers 321 and 325 depict an approximate demarcation for the selectively crystallized portion 321p and the first tunnel barrier 325t. In contrast to the examples depicted in FIGS. 1A through 2C, the plurality of conformal thin-film layers that form the memory element 320 are not substantially planar layers across an entirety of those layers or in a region proximate the first electrode 311. Namely, because the first electrode 311 is not substantially flush with its adjacent layers and stands proud of its adjacent layers. Consequently, the thin-film layers (321, 325) are conformally layered one above the other over the first electrode 311 and have substantially uniform thicknesses (t1 and t2) in the region above the first electrode 311. Typically, the CMO layer 321 is substantially thicker than the layer 325 so that t1>>t2.

The non-ohmic device 330 includes a second electrode 313 in contact with the first tunnel barrier 325t, a second tunnel barrier 327 in contact with the second electrode 313 and made from a second electrically insulating material, and a third electrode 315 in contact with the second tunnel barrier 327. A hard mask layer 341 of an electrically conductive material is in contact with the third electrode 315. During fabrication, the hard mask layer 341 allows for the patterning and etching of the layers of material that are used to form the non-ohmic device 330 such that unmasked portions of those layers are etched away and what remains are the discrete layers 313, 327, and 315.

The second cladded conductor 302 includes a second core conductor 306 and a second composite cladding 304 that is in contact with and completely surrounds the second core conductor 306. The second composite cladding 304 includes a first material 304a and a second material 304b. A portion of the first material 304a is in contact with the hard mask 341. A dielectric material 360 is in contact with sidewall surfaces of the non-ohmic device 330 and the hard mask 341.

Figure 3B:
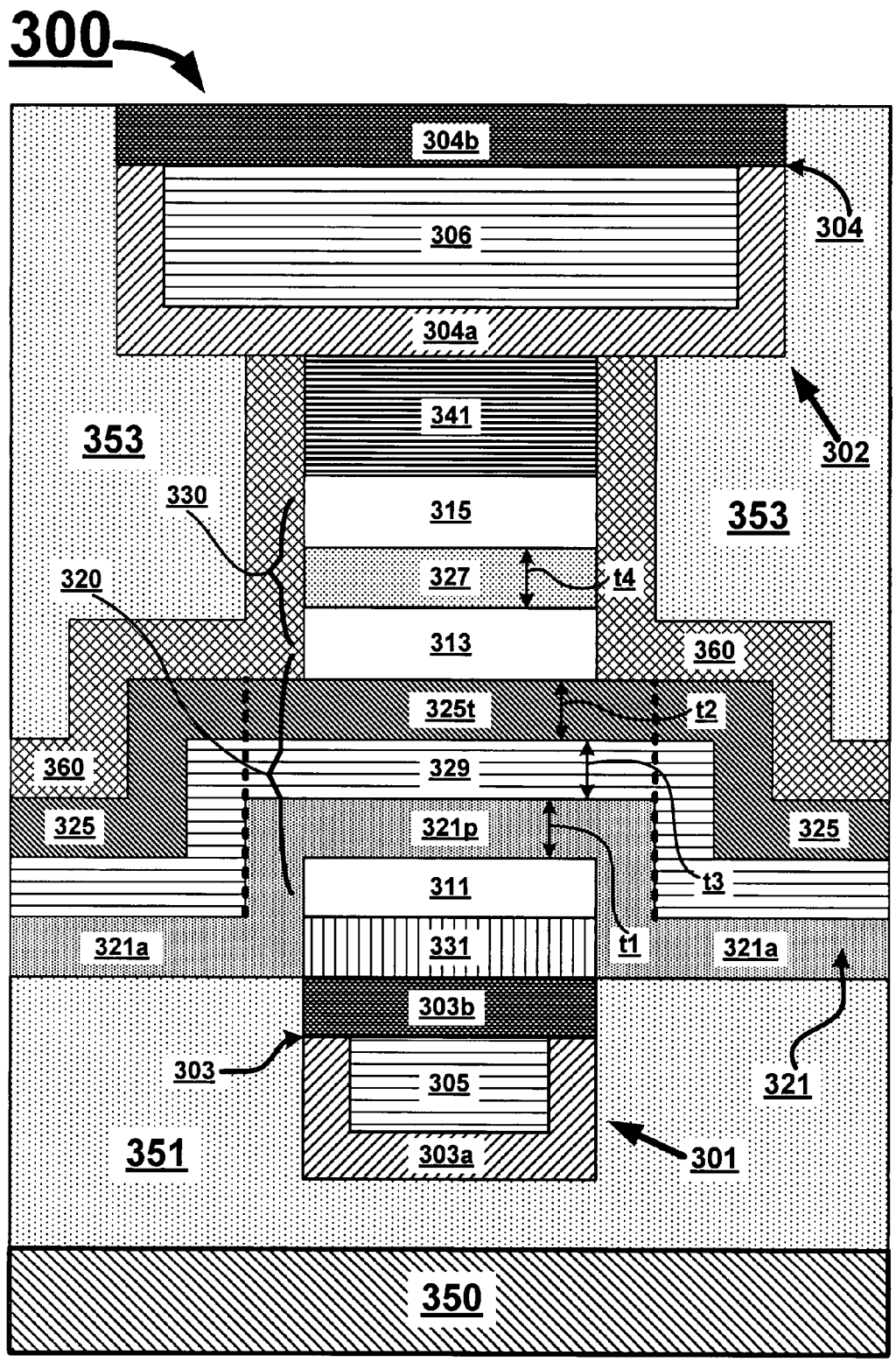
FIG. 3B is a cross-sectional view depicting a structure for a sixth exemplary memory device.

FIG. 3B depicts an alternative configuration of the memory element 320 where the plurality of conformal thin-film layers may optionally include an ion barrier layer 329 as was described above in reference to FIG. 1B. The ion barrier layer 329 is a conformal layer positioned between and in contact with the CMO 321 and the first electrically insulating material 325. The ion barrier layer 329 has a substantially uniform thickness t3 in the region above the first electrode 311. Typically, the CMO layer 321 is substantially thicker than the layers 325 and 329 so that t1>>t2 and t1>>t3.

In the examples depicted in FIGS. 3A and 3B, the first material (303a and 304a) for the first and second composite claddings (303 and 304) can be an electrically conductive material including but not limited to tantalum (Ta), tantalum nitride (TaN), titanium (Ti), and titanium nitride (TiN). The second material (303b and 304b) for the first and second composite claddings (303 and 304) can be an electrically conductive material. If the core conductors (305 and/or 306) are made from copper (Cu), then it is preferable that the second material be cobalt tungsten phosphide (CoWP). Preferably, the CoWP is formed using an electroless deposition process.

The use of CoWP for the second material (303b and 304b) serves as a capping layer when copper (Cu) is used for the core conductors (305 and 306). One advantage of the CoWP is that it prevents electro-migration of the copper that can be caused by a high current density within the core conductor. Furthermore, the first material (303a and 304a) and the second material (303b and 304b) completely encapsulate the copper core conductors (305 and 306) to prevent oxidation of the copper that could otherwise result if surfaces of the core conductors (305 and 306) were exposed. After the copper core conductors (305 and 306) are encapsulated, processing steps or ambient that may include oxygen will not cause oxidation of the copper core conductors.

In the examples depicted in FIGS. 3A and 3B, the memory device 200 may be fabricated over a substrate 350 that includes circuitry that is electrically coupled with the memory device 300. The first and second cladded conductors 301 and 302 can be formed in a dielectric material 351 and 353, respectively (e.g., silicon oxide $SiO_2$). Similarly, a dielectric material (e.g., silicon nitride $SiN_x$) can be used for layers 360.

Figure 4A:
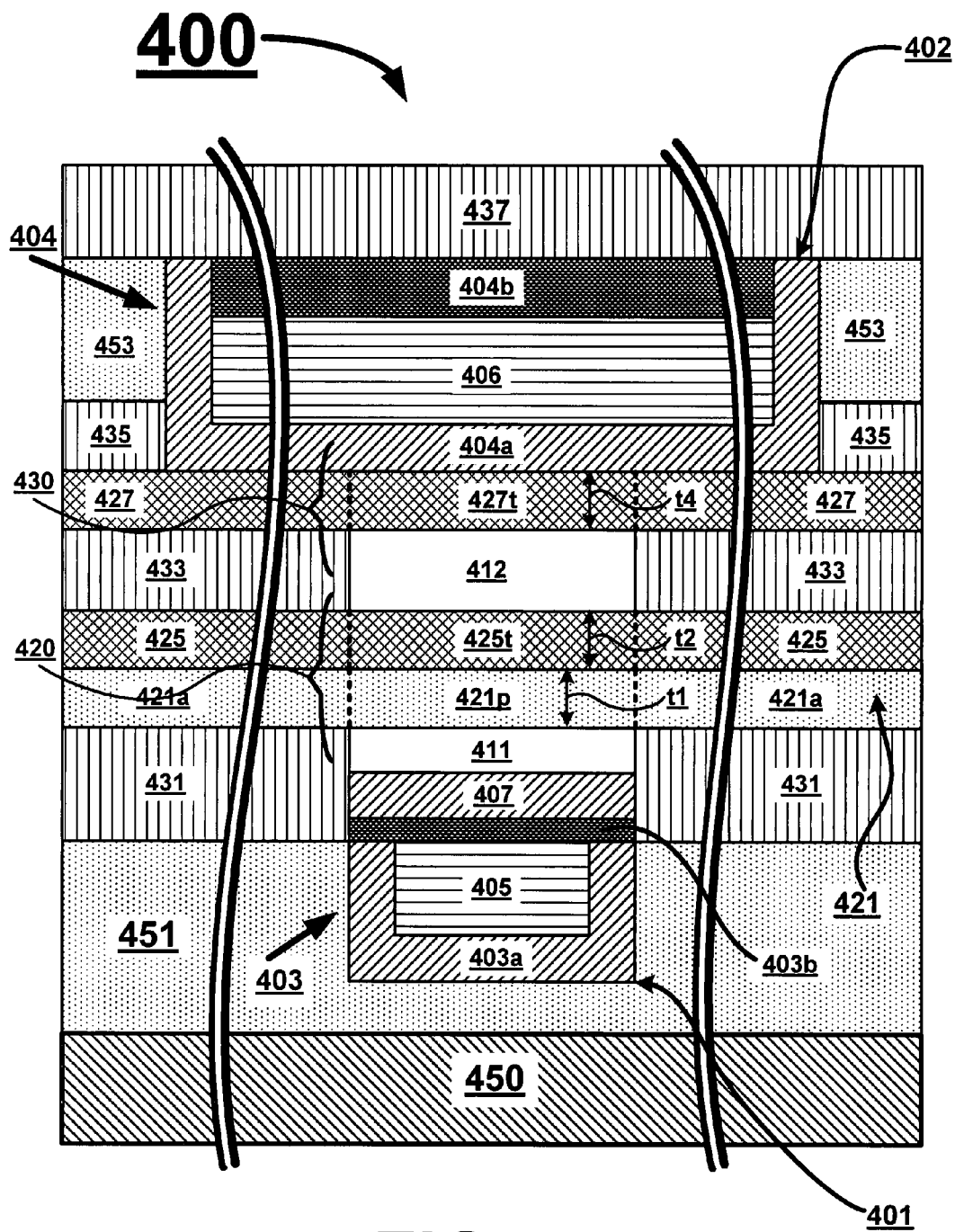
FIG. 4A is a cross-sectional view depicting a structure for a seventh exemplary memory device.

Referring to FIG. 4A, a memory device 400 includes a first cladded conductor 401, a second cladded conductor 402, a memory element 420, and a non-ohmic device 430. The memory element 420 and the non-ohmic device 430 are electrically in series with each other and with the first and second cladded conductors 401 and 402. The first cladded conductor 401 includes a first core conductor 405 and a first composite cladding 403 that is in contact with and completely surrounds the first core conductor 405. The first composite cladding 403 includes a first material 403a and a second material 403b. A first electrically conductive adhesion layer 407 is in contact with the second material 403b and is operative to promote adhesion between the second material 403b and a first electrode 411 that is in contact with the first adhesion layer 407, particularly when the material for the first electrode 411 is a noble metal, such as platinum (Pt), for example. The first electrode 411 includes a substantially planar surface that is substantially flush with a dielectric material 431 that surrounds sidewall surfaces of the first electrode 411.

The memory element 420 includes a plurality of substantially planar thin-film layers that include a layer 421 of CMO and a layer 425 of a first electrically insulating material. The layer of CMO 421 is in contact with the substantially planar surface of the first electrode 411 and includes a selectively crystallized portion 421p having a polycrystalline structure and an amorphous portion 421a having an amorphous structure. The layer 425 of the first electrically insulating material includes a tunnel barrier 425t in contact with the selectively crystallized portion 421p of the CMO 421. In the layers 421 and 425, dashed lines depict an approximate demarcation for the selectively crystallized portion 421p and the first tunnel barrier 425t.

The second cladded conductor 402 includes a second core conductor 406 and a second composite cladding 404 that is in contact with and completely surrounds the second core conductor 406. The second composite cladding 404 includes a first material 404a and a second material 404b.

The non-ohmic device 430 includes a second electrode 412 in contact with the first tunnel barrier 425t, a substantially planar layer 427 of a second electrically insulating material that includes a second tunnel barrier 427t that is in contact with the second electrode 412 and a portion of the first material 404a of the second composite cladding 404.

Figure 4B:
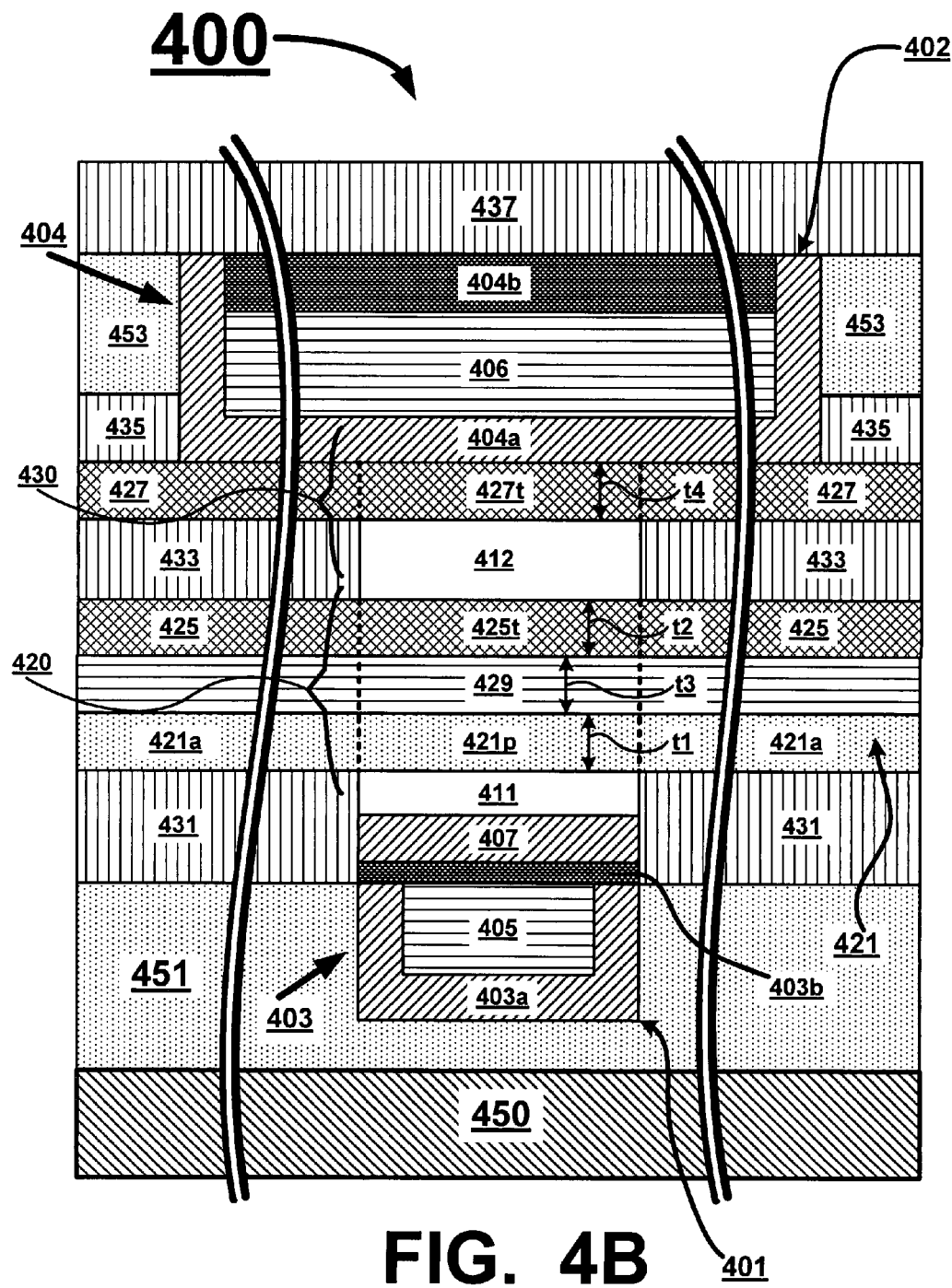
FIG. 4B is a cross-sectional view depicting a structure for an eighth exemplary memory device.

FIG. 4B depicts an alternative configuration of the memory element 420 where the plurality of substantially thin-film layers optionally includes an ion barrier layer 429 as was described above in reference to FIG. 1B. The ion barrier layer 429 is positioned between and in contact with the CMO 421 and the first electrically insulating material 425.

In FIGS. 4A and 4B, the first material (403a and 404a) for the first and second composite claddings (403 and 404) can be an electrically conductive material including but not limited to tantalum (Ta), tantalum nitride (TaN), titanium (Ti), and titanium nitride (TiN). The second material (403b and 404b) for the first and second composite claddings (403 and 404) can be an electrically conductive material. If the core conductors (405 and/or 406) are made from copper (Cu), then it is preferable that the second material be cobalt tungsten phosphide (CoWP). Preferably, the CoWP is formed using an electroless process. The advantages of CoWP were described above in reference to FIGS. 3A and 3B.

In the examples depicted in FIGS. 4A and 4B, the memory device 400 may be fabricated over a substrate 450 that includes circuitry that is electrically coupled with the memory device 400. The first cladded conductor 401 can be formed in a dielectric material (e.g., silicon oxide $SiO_2$) for layer 451. The second cladded conductor can be formed in one or more dielectric materials for the layers 435 and 453, such as silicon nitride ($SiN_x$) for the layer 435 and silicon oxide ($SiO_2$) for the layer 453, for example. Similarly, a dielectric material (e.g., silicon nitride $SiN_x$) can be used for layers 431, 433, and 437.

Non-Ohmic Device

In a two-terminal cross-point memory array implemented using a single memory layer or a plurality of vertically stacked memory layers, performance can be improved if the non-ohmic device is implemented electrically in series with the memory element. Desired performance parameters for the non-ohmic device include a high half-select ratio (HSR) such that a ratio of the current flowing through a selected memory element to the current flowing through half-selected memory elements is as large as possible. A selected memory element is one having a read or a write voltage applied across its terminal (e.g., the first and second cladded conductors). A half-selected memory element is one having one terminal at a read or write voltage potential and the other terminal at a non-select voltage potential, such as a ground potential, for example. A memory element is un-selected when both of its terminals are at the non-select voltage potential.

As one example, a HSR of approximately 1000:1 or larger is preferable. More preferably, the HSR is approximately 4000:1 or larger. The larger the HSR, the lower the power dissipation caused by current flow in half-selected memory elements, the greater the signal-to-noise ratio (S/N) during read operations, and the lower the possibility for read or write disturbs to half-selected elements. The S/N ratio is a ratio of a read current flowing through a memory element selected for a read operation to the sum of all half-select currents that flow through half-selected memory elements during the read operation. An exemplary non-ohmic device allows for significantly more conduction at higher voltages (e.g., at read and write voltages) applied across the memory element than at low voltages (e.g., half-select and un-select voltages). The difference in conduction between high and low voltages can be observed on an I-V curve, where a steep slope in the I-V curve is indicative of significantly more conduction at higher applied voltages.

In the memory devices depicted in FIGS. 1A through 4B, the non-ohmic device is optional and can be used in applications where the I-V characteristics of the memory element do not provide a high enough HSR and/or where the S/N ratio during read operation is too low and can result in corrupted data due to the noise from the half-select currents overwhelming the read current signal. In configurations that do not include the non-ohmic device, the memory element can be electrically coupled with the first and second cladded conductors using electrically conductive materials, such as one or more electrodes, for example. Additionally, in that the memory element and the non-ohmic device are electrically in series with each other and with the first and second cladded conductors, the positions of the memory element and the non-ohmic device in the memory device can be switched such that the non-ohmic device is on the bottom (i.e., closest to the first cladded conductor) and the memory element can positioned above the non-ohmic device (i.e., closest to the second cladded conductor).

Figure 13:
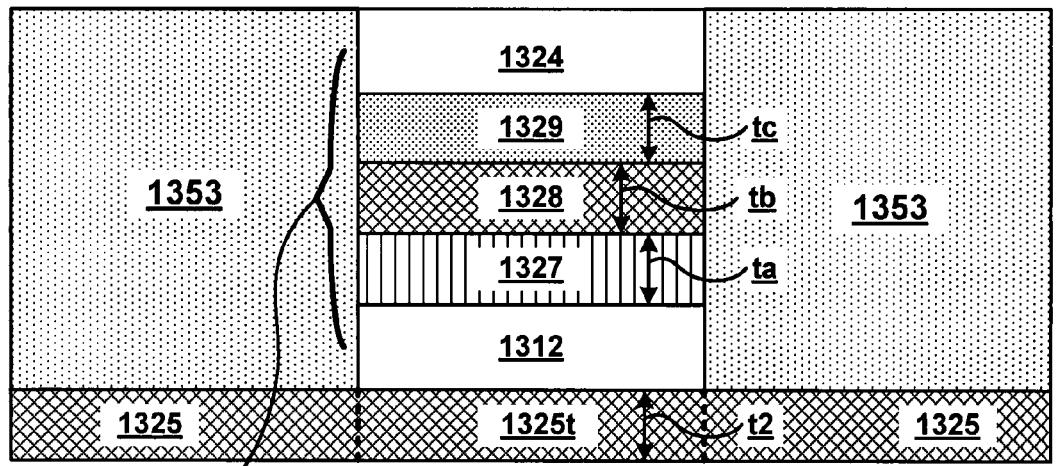
FIG. 13 depicts one example of a multi-layer non-ohmic device.
Figure 14:
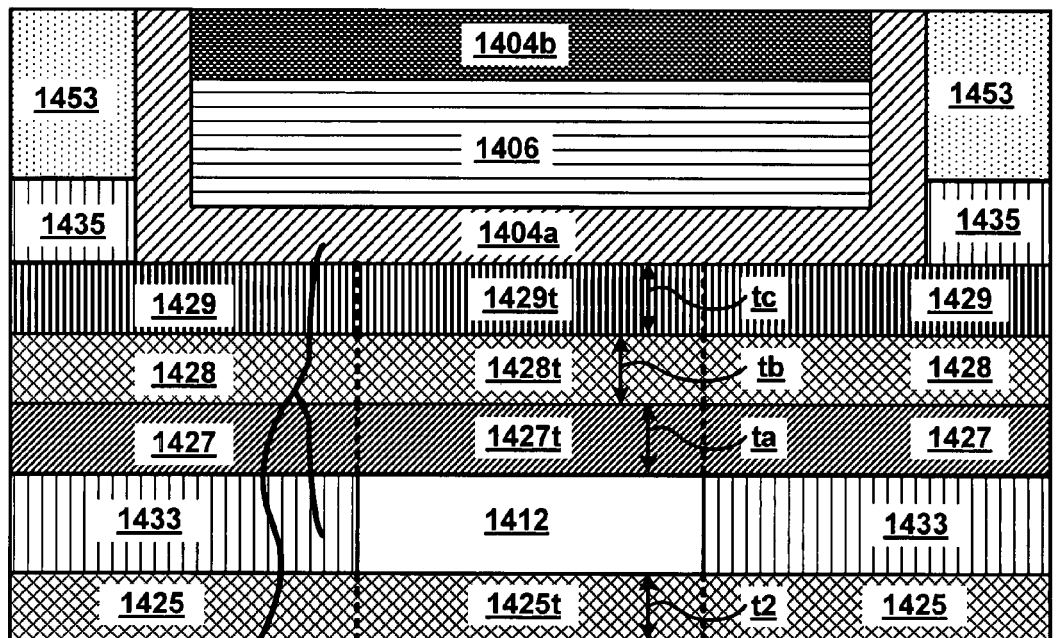
FIG. 14 depicts another example of a multi-layer non-ohmic device.

Although the above description has depicted non-ohmic devices incorporating a single layer of electrically insulating material sandwiched between a pair of electrically conductive materials (e.g., electrodes), the non-ohmic device can include a plurality of layers of electrically insulating materials where at least one of the plurality of layers are made from different materials. The I-V characteristics of the non-ohmic device can be optimized or tailored to a specific application be a careful selection of materials, material thicknesses, material dielectric constants, and work functions of the electrodes. Different materials can include materials having the same elemental composition (e.g., aluminum Al and oxygen O) but different stoichiometries. The resulting non-ohmic device can have a metal-insulator-insulator-metal (MIIM) structure or a metal-insulator-insulator-insulator-metal (MIIIM), for example. The MIIIM structure can be configured to implement crested or resonant tunnel barrier non-ohmic devices. For example, the materials for the MIIIM structure can be selected to give the non-ohmic device uni-polar or bi-polar I-V characteristics. Bi-polar I-V characteristics may be preferable where read and write voltages are applied as bi-polar voltages with a positive voltage potential applied to one of the cladded conductors and a negative voltage potential applied to the other cladded conductor. Bi-polar I-V characteristics can also enable alternating read voltage polarities which can be useful in preventing wear out of the memory element. On the other hand, uni-polar I-V characteristics may be preferable where read and/or write voltages are applied as uni-polar voltages. For example, the uni-polar I-V characteristics can be tailored to allow only one polarity of the read voltage to be operative for reading stored data. However, opposite polarities of the write voltage can be used to write data because of a magnitude of the write voltages is higher than a magnitude of the read voltage. FIG. 13 depicts one example of a non-ohmic device 1300 that includes three tunnel barrier layers 1327, 1328, and 1329 having thicknesses ta, tb, and tc, respectively. One or more of the three layers are made from different materials. For purposes of explanation, other layers in the memory device positioned below the first tunnel barrier 1325t are not shown. The non-ohmic device 1300 is sandwiched between a pair of electrodes 1312 and 1324. The electrode 1324 can be electrically coupled with the second cladded conductor (not shown). FIG. 14 depicts another example of a non-ohmic device 1400 that includes three tunnel barrier layers 1427, 1428, and 1429 having thicknesses ta, tb, and tc, respectively. One or more of the three layers are made from different materials. For purposes of explanation, other layers in the memory device positioned below the first tunnel barrier 1425t are not shown. The non-ohmic device 1400 is sandwiched between a pair of electrodes 1412 and 1404a. Although FIGS. 13 and 14 depict three tunnel barrier layers (i.e., a MIIIM structure), the non-ohmic device can include at least two tunnel barrier layers (i.e., a MIIM structure).

Figure 5:
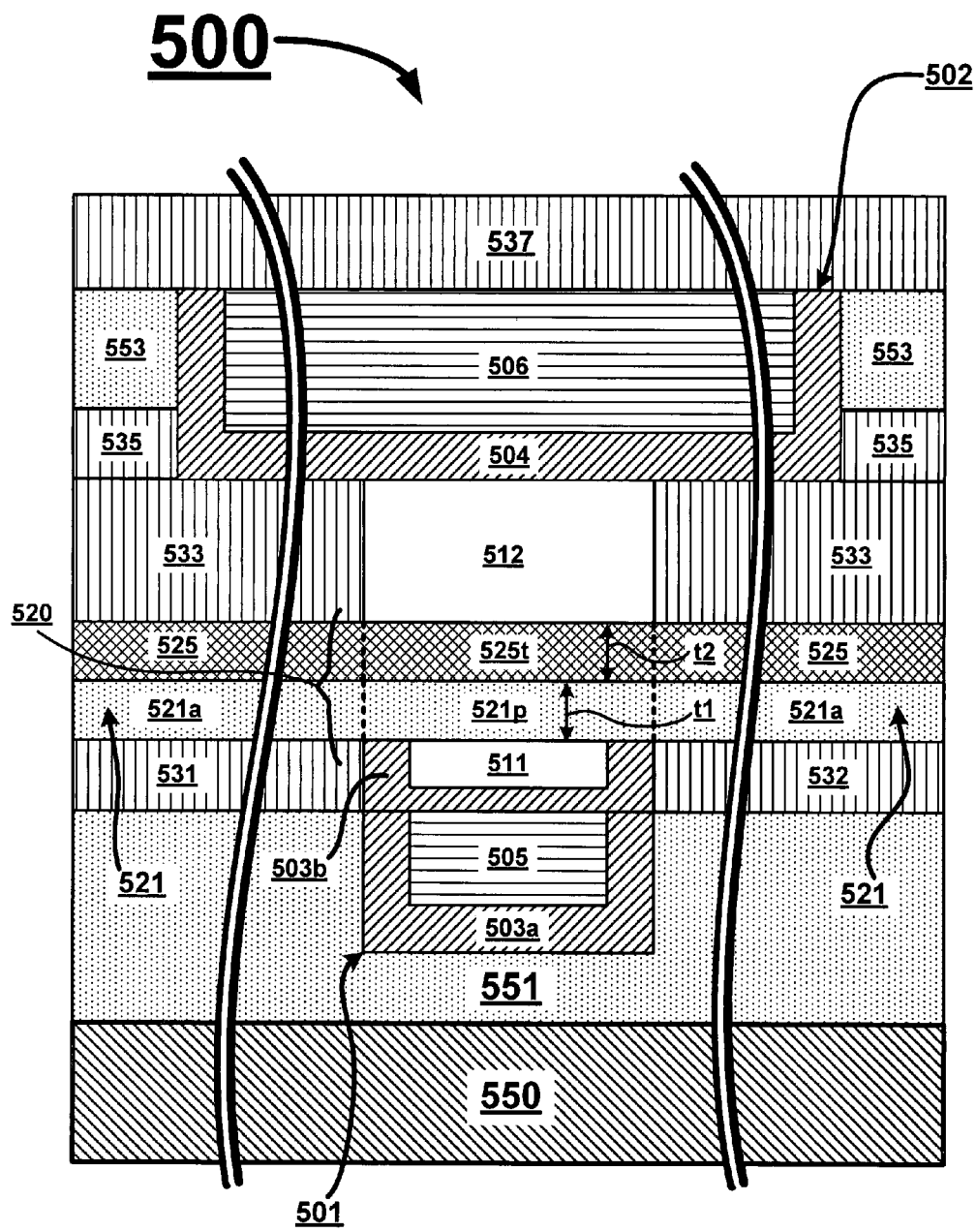
FIG. 5 is a cross-sectional view depicting a structure for an exemplary memory device that does not include a non-ohmic device.

Reference is now made to FIG. 5, where a memory device 500 includes a first cladded conductor 501, a second cladded conductor 502, and a memory element 520. The memory device 500 is identical to the memory device 100 depicted in FIG. 1A with the exception that the memory device 500 does not include a non-ohmic device. A second electrode 512 is in contact with a first tunnel barrier 525t and a second outer cladding 504 of the second cladded conductor 502. As a result, the memory element 520 is electrically in series with the first and second cladded conductors 501 and 502. The memory device 500 may include the optional ion barrier layer (not shown) as described above in reference to FIG. 1A. The ion barrier layer can be positioned between and in contact with a CMO layer 521 and a layer 525 of a first electrically insulating material. Although a single electrode 512 is depicted in FIG. 5, one or more additional thin-film layers of material may be used in the memory element 520 to effectuate the electrical coupling to the second cladded conductor. Those layers include but are not limited to adhesion layers, glue layers, and anti-reflection layers, for example. As one example, if the electrode 512 is made from a noble metal (e.g., platinum Pt), then an adhesion layer may be used between the electrode 512 and the second outer cladding 504. One skilled in the art will appreciate that the modification to the example depicted in FIG. 1A can be applied to the examples depicted in FIGS. 1B through 4B, that is, the non-ohmic devices depicted in those figures can be eliminated and the memory element electrically coupled with the second cladded conductor using one or more layers of electrically conductive materials. The resulting structure places the memory element electrically in series with the first and second cladded conductors. The elimination of the non-ohmic device may result in the elimination or alteration of one or more of the dielectric layers depicted in FIGS. 1A through 4B.

Conductive Metal Oxide (CMO)

The thin-film layer of the CMO depicted in FIGS. 1A through 5 can be made from a material including but not limited to a manganite, and a perovskite, just to name a few. Suitable perovskite materials include but are not limited to PCMO, LCMO, LSMO, and LNO. As deposited in the memory device, the CMO layer can have an amorphous structure or a crystalline structure (e.g., a polycrystalline structure). If the structure of the entire CMO layer is amorphous, then various techniques can be used to effectuate the selective crystallization of the portion of the layer that is adjacent to the first electrode. On the other hand, if the CMO layer has a polycrystalline structure, then various techniques can be used to reduce conductivity of the CMO layer in regions that are not in contact with the first electrode. As a result, the portion of the CMO layer that is in contact with the first electrode will be a high conductivity region and portions of the CMO layer not in contact with the CMO will be low conductivity regions.

Figure 6A:
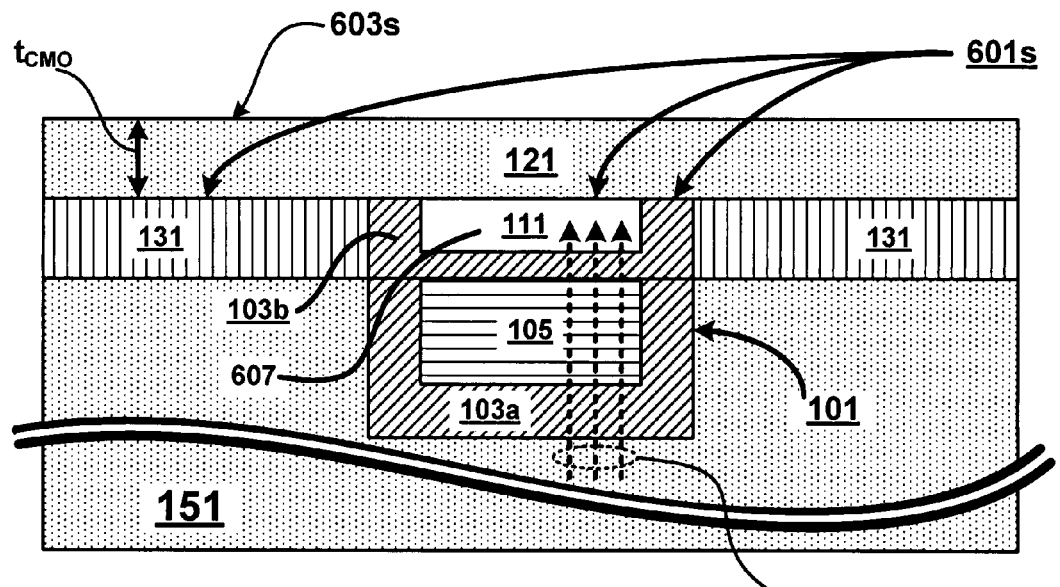
FIGS. 6A and 6B are cross-sectional views depicting one example of selective crystallization of a thin-film layer.

Reference is now made to FIG. 6A, where a substantially planar layer 121 of amorphous CMO has been deposited on a substantially planar surface 601s of an underlying structure including the first electrode 111, a section 103b of the first outer cladding, and dielectric layers 131 (e.g., $SiN_x$). For purposes of explanation, the other layers and structures depicted in FIGS. 1A and 1B are not shown. Preferably, the CMO 121 has a substantially uniform thickness $t_{CMO}$ across the entire layer. Although the thickness $t_{CMO}$ will be application dependent, typical ranges of thickness are from about 150 Å to about 350 Å. For example, the CMO 121 can have a thickness of approximately 250 Å. After the CMO 121 has been deposited, the selective crystallization of the portion 121p can be due to several factors including but not limited to a crystal orientation 607 of the material selected for the first electrode 111, to heat 609h concentration in the area around the first cladded conductor 101, or both.

Figure 6B:
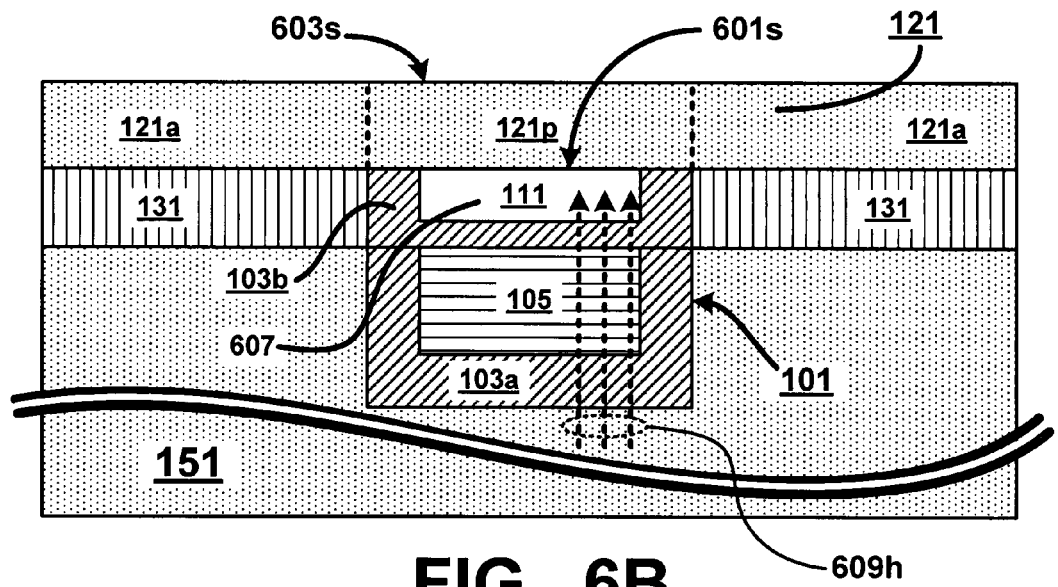

As one example, the first electrode 111 can be made from platinum (Pt) or an alloy of platinum having a <111> crystal orientation. In FIG. 6B, growth of an approximate <111> crystalline orientation in the portion of the CMO layer 121 that is adjacent to and in contact with the first electrode 111 (i.e., portion 121p) is encourage by the contact between the surface 601s of the first electrode 111 and the CMO 121. The change in morphology from the amorphous CMO structure to the polycrystalline CMO structure 121p can be aided by heat 609h. For example, heat in the processing environment during fabrication of the memory device can result in a concentration of heat 609h in the area around the first cladded conductor 101, particularly if the material for the first core conductor 101 is copper (Cu) because copper retains heat. The resulting thermal environment around the first electrode 111 enhances the structural change from amorphous 121a to polycrystalline 121p. As noted above, the dashed lines depicting demarcation between the amorphous 121a and polycrystalline 121p portions of the CMO 121 are an approximation and the actual demarcation will not be as abrupt. The use of heat to effectuate the change in morphology may be required even though there may be some change in morphology due the contact between the <111> surface and the CMO 121. That is, mere contact alone is not enough to effectuate a complete transformation from amorphous to polycrystalline and the application of heat is necessary to form the polycrystalline portion 121p. The examples depicted in FIGS. 6A and 6B also apply to the formation of the polycrystalline and amorphous portions of the CMO layers depicted in FIGS. 2A through 5.

Figure 7:
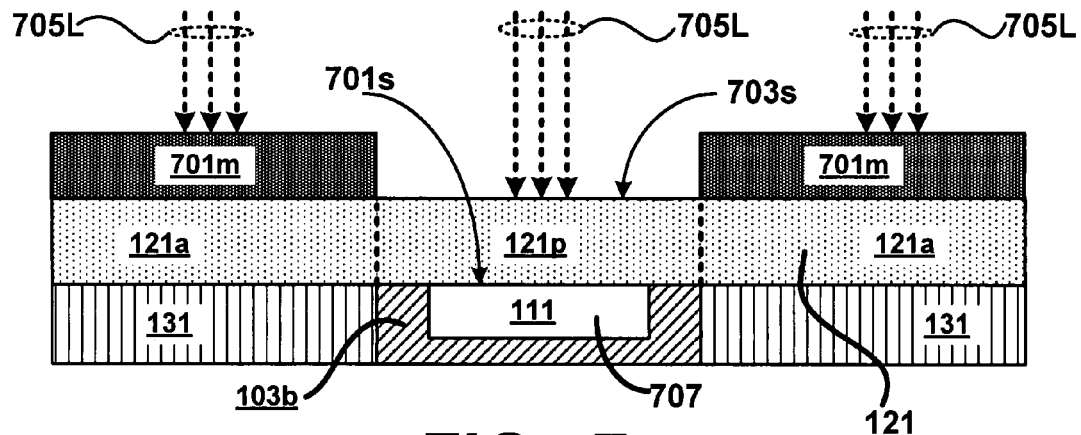
FIG. 7 is a cross-sectional view depicting one example of selective crystallization of a thin-film layer using laser irradiation.

Turning now to FIG. 7, portions of an amorphous CMO layer 121 are masked off using masks 701m in contact with portions 121a that are to remain amorphous. A surface 703s is not masked and is exposed to irradiation by a laser beam 705L that impinges on the CMO and generates heat locally in the unmasked region. Heat generated by the laser beam 705L selectively crystallizes the CMO to form the polycrystalline portion 121p. This process is sometimes referred to as laser crystallization or laser annealing. As noted above, mere contact between the <111> surface 701s of the electrode 111 and the CMO 121 may not be adequate to selectively crystallize the entire polycrystalline portion 121p. Therefore, the local heating generated by the laser beam 705L is operative to ensure the entire portion 121p is polycrystalline. The laser beam 705L can be generated by an excimer laser, for example. The laser beam 705L can raster scan the CMO layer 121 with the beam 705L being blocked by the masks 701m and irradiating the exposed surface 703s to form the polycrystalline portions 121p. Alternatively, the laser beam 705L can be precision directed to impinge on pre-selected sites on the surface 701s of the CMO layer 121 were the polycrystalline portions 121p are to be formed, thereby eliminating the need for the masks 701m. Data from place and route or chip layout can be used to control the laser and direct the beam 705L so that it irradiates only those portions of the CMO that are to be selectively crystallized.

Figure 8:
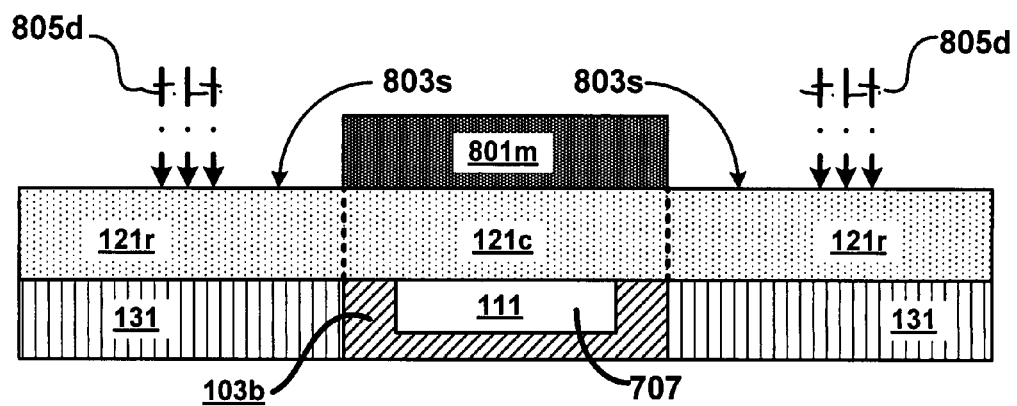
FIG. 8 is a cross-sectional view depicting one example of doping a thin-film layer.

Referring now to FIG. 8, it may be desirable to deposit a polycrystalline layer of CMO 121. However, because the memory element 120 (not shown) is electrically in series with the first and second cladded conductors (101, 102), it is desirable to ensure that a portion 121c of the CMO 121 that is in contact with the first electrode 111 has the highest conductivity and the portions 121r of the CMO 121 that are not in contact with the first electrode 111 have a lower conductivity than the portion 121c. The difference in conductivities between the portions 121c and 121r ensures that a preferential path for current flow is substantially through the memory element because the portion 121c has a high conductivity and offers a path with the least resistance to electron flow as opposed to the low conductivity portions 121r. Dashed lines in the CMO layer 121 depict an approximate demarcation between the high and low conductivity portions of the CMO 121. The difference in conductivities can be accomplished by altering the electrical properties of the CMO 121 through doping. A mask 801m can be positioned in contact with the CMO 121 over the high conductivity portion 121c. A dopant 805d is applied and portions of the CMO beneath unmasked surfaces 803s are doped, resulting in a lowering of the conductivity in the portions 121r. The dopant can be selected to make the low conductivity portions 121r electrically neutral (e.g., counter doping) such that if the CMO 121 is p-type, the dopant is selected to make the portions 121r n-type. Conversely, if the CMO 121 is n-type, the dopant is selected to make the portions 121r p-type.

Figure 9:
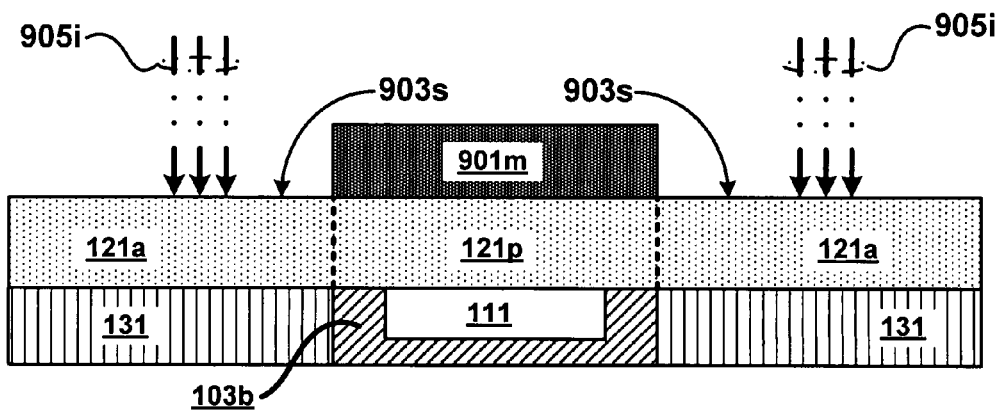
FIG. 9 is a cross-sectional view depicting one example of ion implantation of a thin-film layer.

Turning now to FIG. 9, the polycrystalline and amorphous portions (121p, 121a) of the CMO 121 can be formed as described above in reference to FIGS. 6A through 7. However, for some of the same reasons as described above in reference to FIG. 8, it may be desirable to reduce the conductivity of the amorphous portions 121a. A mask 901m can be positioned in contact with the selectively crystallized portion 121p and the unmasked portions of the CMO 121 can be ion implanted 905i through exposed surfaces 903s with a species of ion operative to reduce the conductivity of the amorphous portions 121a. Elements including but not limited to helium (He), neon (Ne), xenon (Xe), krypton (Kr), and argon (Ar) can be used as the species of implanted ion. Preferably, the amorphous portions 121a are implanted with argon (Ar) ions. The mask 901m need not be a dedicated mask such as the type formed by using a photoresist or a hard mask layer. Instead, an already existing structure in the memory device can be used as a mask that shields the selectively crystallized portion 121p during implantation. As one example, in FIGS. 3A and 3B, one or more layers of the non-ohmic device 330 can be used as a mask during fabrication of the memory device 300. During ion implantation of portions 321a, the non-ohmic device 330 shields the selectively crystallized portion 321p and the first tunnel barrier 325t from ions.

Ion Barrier Layer

Suitable materials for the ion barrier layer include but are not limited to a perovskite material, such as strontium titinate (STO), for example. The STO can be a reduced strontium titinate. A thickness t3 of the ion barrier layer can be in range from about 5 Å to about 15 Å, for example. The thickness t2 of the first tunnel barrier can also determine the thickness of the ion barrier layer. For example, the combined thickness for the first tunnel barrier and the ion barrier layer (i.e., t2+t3) can be approximately 20 Å with the thicknesses of both layers being approximately 10 Å each.

First and Second Tunnel Barriers

Suitable materials for the layer of the first electrically insulating material (i.e., the first tunnel barrier) include High-k dielectric materials. For example, materials including but not limited to $SiO_2$, $Al_2O_3$, $SiN_x$, $HfSiO_x$, $ZrSiO_x$, $Y_2O_3$, $Gd_2O_3$, $LaAlO_3$, $HfO_2$, $ZrO_2$, $Ta_2O_5$, $TiO_x$, yttria-stabilized zirconia (YSZ), $Cr_2O_3$, and $BaZrO_3$ can be used for the first tunnel barrier. The thickness t2 of the first tunnel barrier will be less than approximately 50 Å. Preferably, the thickness t2 is in a range from about 5 Å to about 30 Å. An exemplary material for the first tunnel barrier is yttria-stabilized zirconia (YSZ).

Suitable materials for the second tunnel barrier include but are not limited to $SiO_2$, $Al_2O_3$, $SiN_x$, $HfSiO_x$, $ZrSiO_x$, $Y_2O_3$, $Gd_2O_3$, $LaAlO_3$, $HfO_2$, $ZrO_2$, $Ta_2O_5$, $TiO_x$, yttria-stabilized zirconia (YSZ), $Cr_2O_3$, and $BaZrO_3$. The thickness t4 of the second tunnel barrier will be less than approximately 100 Å. Preferably, the thickness t4 is in a range from about 15 Å to about 50 Å. If multiple tunnel barrier layers are used for the non-ohmic device (e.g., MIIM and MIIIM structures), then the layer thicknesses may be less than 15 Å for one or more of the layers. Suitable materials for the multiple tunnel barrier layers include but are not limited to carefully selected combinations of the materials listed above for the second tunnel barrier.

Core Conductors

Suitable electrically conductive materials for the first and second core conductors include but are not limited to aluminum (Al), tungsten (W), titanium (Ti), copper (Cu), and alloys of those materials. An exemplary material for the first and second core conductors is copper (Cu) because of its high conductivity, its resistance to electro-migration, its ability to withstand higher current densities, and industry trends towards standardizing on copper for metallization and interconnect structures.

Memory Element Thin-Film Layers

One advantage of the memory device is that during fabrication, the plurality of thin-film layers that define the memory element are deposited upon one another and are not etched to form discrete layers of material for each memory device. Eliminating the etching of those layers has several advantages including the elimination of additional processing steps that could introduce yield limiting defects. Furthermore, the thin-film layers are typically etched using a plasma etching process. The during plasma etching, damage can occur to the layers along their exposed sidewall surfaces. Moreover, the plasma contains etch by-products that can be re-deposited on exposed surfaces of the memory element. Those by-products can result in defects and compromised device performance. Therefore, it is desirable to form a memory element without having to etch through the CMO layer, the first electrically insulating layer, or the optional ion barrier layer.

Cross-Point Array Architecture

Figure 10:
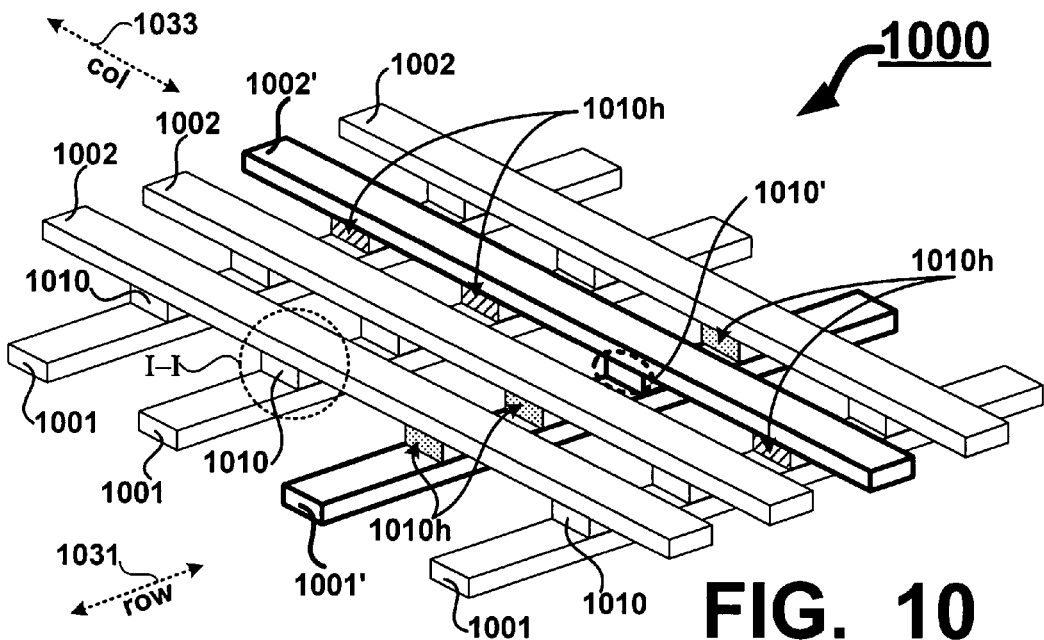
FIG. 10 depicts one example of a two-terminal cross-point memory array.

Reference is now made to FIG. 10, where a two-terminal cross-point array 1000 includes a plurality of the memory devices 1010, a plurality of first cladded conductors 1001, and a plurality of second cladded conductors 1002. The plurality of first and second cladded conductors (1001, 1002) are positioned substantially orthogonal to each other and do not come into contact with one another. Each memory device 1010 is positioned at an intersection of one of the plurality of first cladded conductors 1001 with one of the plurality of second cladded conductors 1002. Each memory device 1010 is also electrically in series with its respective first and second cladded conductors (1001, 1002). The application of a select voltage (e.g., a read or write voltage) across first and second cladded conductors (1001', 1002') is operative to select memory device 1010' for a data operation. Memory elements 1010h are half-selected and memory elements 1010 are un-selected. The first cladded conductors 1001 can be aligned with a row direction 1031 (e.g., along a X-axis) and the second cladded conductors 1002 can be aligned with a column direction 1033 (e.g., along a Y-axis). A section I-I depicts a portion of the array 1000 that is depicted in FIGS. 1A through 5. One skilled in the microelectronics art will appreciate that exposed surfaces of the array 1000 would be surrounded by dielectric materials (not shown) that provide electrical isolation and passivation, such as silicon oxide ($SiO_2$) and silicon nitride ($SiN_x$), for example. The memory devices described herein are not limited to cross-point array implementations and may be used in other types of memory architectures.

Figure 11:
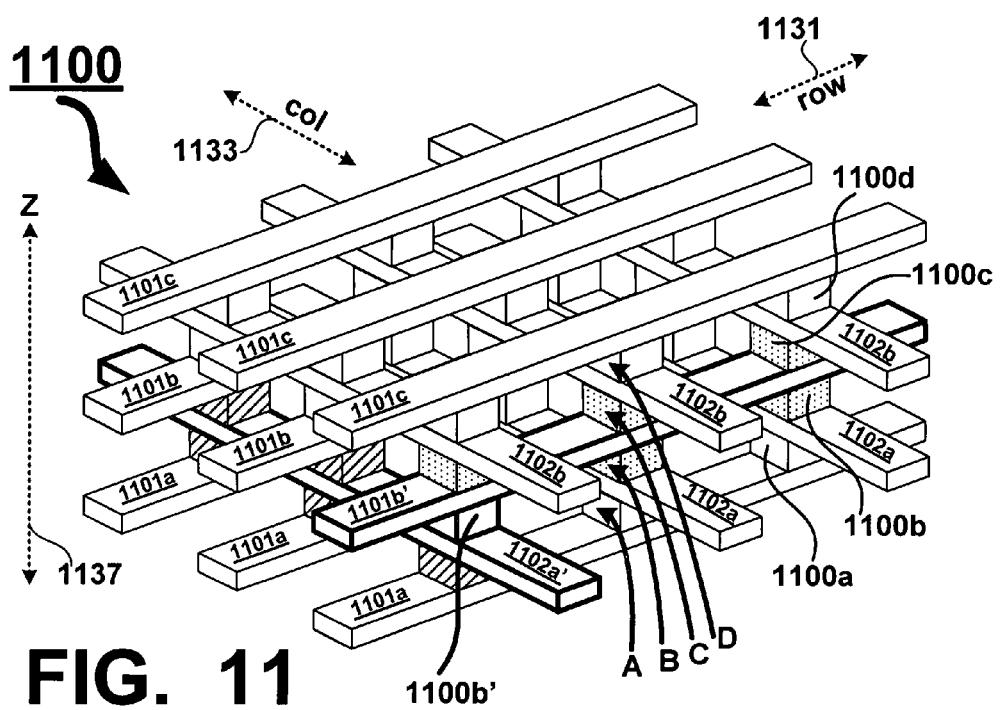
FIG. 11 depicts one example of a stacked two-terminal cross-point memory array.

Turning now to FIG. 11, a multiple-layer cross-point array 1100 includes four layers denoted as A, B, C, and D with a plurality of memory devices on each layer. Memory devices on layer A are denoted as 1100a, memory devices on layer B are denoted as 1100b, memory devices on layer C are denoted as 1100c, and memory devices on layer D are denoted as 1100d. The memory layers are vertically stacked upon one another in a vertical direction 1137 (e.g., along a Z-axis). A plurality of first cladded conductors 1101a, 1101b, and 1101c are aligned with a row direction 1131 (e.g., along a X-axis) and a plurality of second cladded conductors 1102a and 1102b are aligned with column direction 1133 (e.g., along a Y-axis). The plurality of first and second cladded conductors are positioned substantially orthogonal to each other and do not come into contact with one another. Each of the plurality of memory devices is positioned at an intersection of one of the plurality of first cladded conductors with one of the plurality of second cladded conductors. Each memory device is also electrically in series with its respective first and second cladded conductors. A select voltage is applied across cladded conductors 1101b' and 1102a' to select memory device 1100b' on layer B for a data operation. Memory devices electrically coupled with the cladded conductors 1101b' and 1102a' are half-selected and the remaining memory devices are un-selected. One skilled in the microelectronics art will appreciate that exposed surfaces of the array 1000 would be surrounded by dielectric materials (not shown) that provide electrical isolation and passivation, such as silicon oxide ($SiO_2$) and silicon nitride ($SiN_x$), for example.

In the example depicted in FIG. 11, cladded conductors are shared between memory devices on different layers. However, each layer of the multiple-layer cross-point array can have dedicated first and second cladded conductors and a dielectric material can be positioned between layers to electrically isolate the layers from one another. Accordingly, the number of cladded conductors would increase from the fifteen depicted in FIG. 11 to twenty-four, that is, six per layer times four layers.

Figure 12:
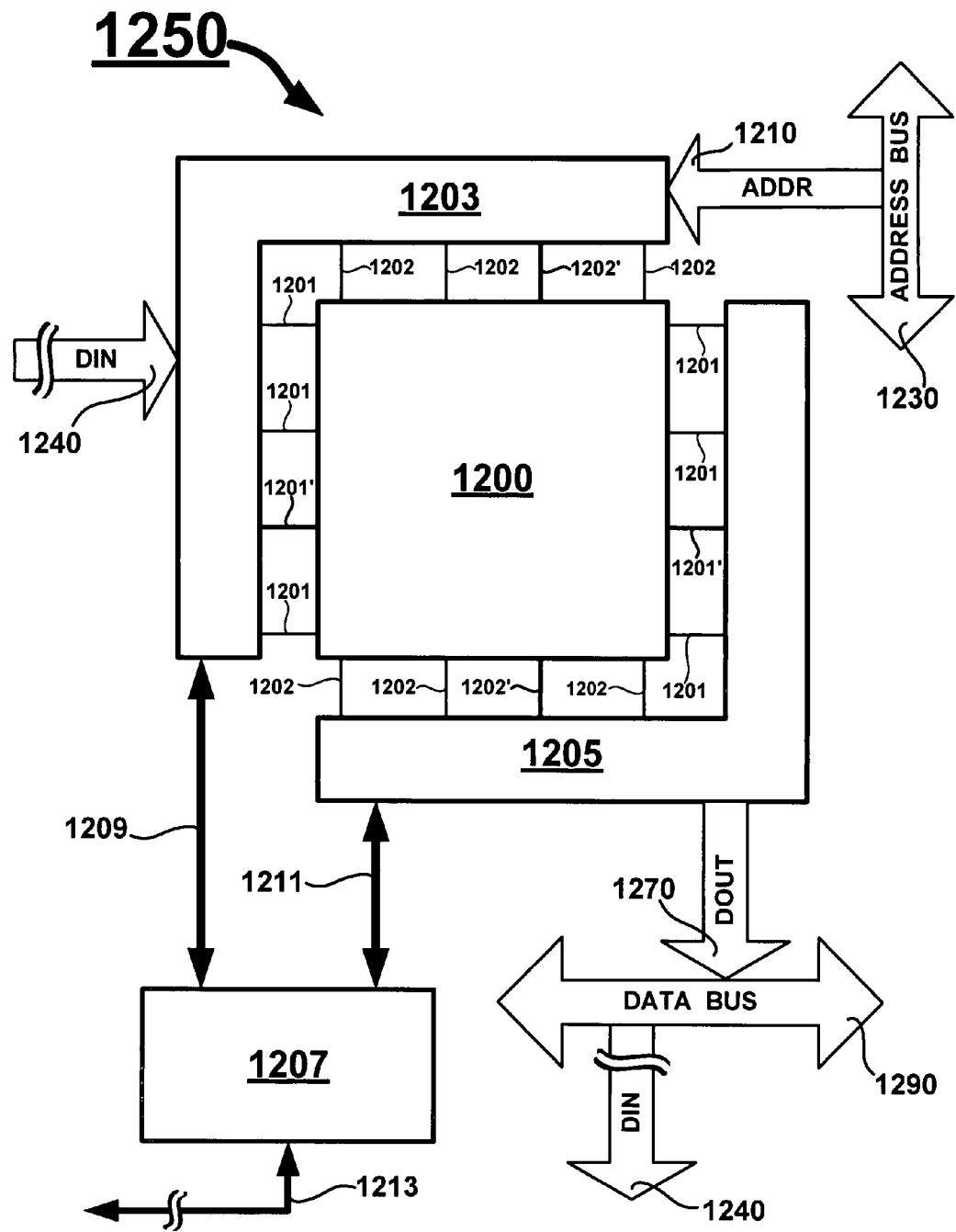
FIG. 12 depicts one example of a memory system.

Referring now to FIG. 12, an exemplary memory system 1250 includes a two-terminal cross-point memory array 1200 (array 1200 hereinafter) including a plurality of first cladded conductors 1210, a plurality of second cladded conductors 1202, an address unit 1203, and a sense unit 1205. The address unit 1203 receives an address ADDR, decodes the address, and based on the address, selects at least one of the plurality of first cladded conductors (denoted as 1201') and one of the plurality of second cladded conductors (denoted as 1202'). The address unit 1203 applies select voltage potentials to the selected first and second cladded conductors 1201' and 1202'. The address unit 1203 also applies a non-select voltage potential to unselected first and second cladded conductors 1201 and 1202. The sense unit 1205 senses one or more currents flowing through one or more of the cladded conductors. During a read operation to the array 1200, current sensed by the sense unit 1205 is indicative of stored data in a memory device (not shown) positioned at an intersection of the first and second cladded conductors 1201' and 1202'. A bus 1210 coupled with an address bus 1230 can be used to communicate the address ADDR to the address unit 1203. The sense unit 1205 processes the one or more currents and at least one additional signal to generate a data signal DOUT that is indicative of the stored data in the selected memory device. In some embodiments, the sense unit 1205 may sense current flowing through a plurality of memory devices and processes those currents along with additional signals to generate a data signal DOUT for each of the plurality of memory devices. A bus 1270 communicates the data signal DOUT to a data bus 1290. During a write operation to the array 1200, the address unit 1203 receives write data DIN to be written to a memory device specified by the address ADDR. A bus 1240 communicates the write data DIN from the data bus 1290 to the address unit 1203. The address unit 1203 determines a magnitude and polarity of the select voltage potentials to be applied to the selected first and second cladded conductors 1201' and 1202' based on the value of the write data DIN. For example, one magnitude and polarity can be used to write a logic "0" and a second magnitude and polarity can be used to write a logic "1". In other embodiments, the memory system 1250 can include dedicated circuitry that is separate from the address unit 1203 to generate the select potentials and to determine the magnitude and polarity of the select potentials.

One skilled in the art will appreciate that the memory system 1250 and its components (e.g., 1203 and 1205) can be electrically coupled with and controlled by an external device (e.g., a microprocessor or a memory controller). Optionally, the memory system 1250 can include at least one control unit 1207 operative to coordinate and control operation of the address and sense units 1203 and 1205 and any other circuitry necessary for data operations (e.g., read and write operations) to the array 1200. One or more signal lines 1209 and 1211 can electrically couple the control unit 1207 with the address and sense units 1203 and 1205. The control unit 1207 can be electrically coupled with an external system (e.g., a microprocessor or a memory controller) through one or more signal lines 1213. The address unit 1203, the sense unit 1205, the control unit 1207, the busses, and the signal lines can be fabricated in a substrate (e.g., a silicon Si wafer) and electrically coupled with the array 1200 that is positioned over the substrate.

CONCLUSION

Although several examples of a memory device have been disclosed and illustrated herein, the invention is not limited to the specific forms or arrangements of parts so described and illustrated. The invention is only limited by the claims.

What is claimed is:

1. A memory device, comprising:
    a first cladded conductor including a first core conductor and a first outer cladding in contact with and completely surrounding the first core conductor;
    a second cladded conductor including a second core conductor and a second outer cladding in contact with and partially surrounding the second core conductor;
    a first electrode in contact with a substantially planar portion of the first outer cladding, the first electrode including a substantially planar surface;
    a memory element operative to store data as a plurality of conductivity profiles and including a plurality of substantially planar thin-film layers including,
        a layer of a conductive metal oxide (CMO) including a selectively crystallized portion in contact with the substantially planar surface of the first electrode and having a polycrystalline structure and an amorphous portion having an amorphous structure, and
        a layer of a first electrically insulating material including a first tunnel barrier in contact with the selectively crystallized portion of the CMO; and
    a second electrode in contact with the first tunnel barrier and a portion of the second outer cladding, wherein the memory element is electrically in series with the first and second cladded conductors.

2. The memory device of claim 1 wherein the plurality of substantially planar thin-film layers further comprises:
    an ion barrier layer positioned between and in contact with the first electrically insulating material and the CMO.

3. The memory device of claim 2, wherein the ion barrier layer comprises strontium titinate (STO).

4. The memory device of claim 1, wherein the amorphous portion of the CMO includes implanted ions operative to decrease a conductivity of the amorphous portion.

5. The memory device of claim 4, wherein the implanted ions comprises argon.

6. The memory device of claim 1, wherein the CMO comprises a perovskite.

7. The memory device of claim 6, wherein the perovskite is selected from the group consisting of PCMO, LCMO, LSMO, and LNO.

8. The memory device of claim 1, wherein the first electrically insulating material comprises yttria-stabilized zirconia (YSZ).

9. The memory device of claim 1, wherein the first electrode comprises platinum.

10. The memory device of claim 9, wherein the platinum includes a substantially <111> crystal orientation and the polycrystalline structure of the selectively crystallized portion has a crystal orientation that is substantially identical to the <111> crystal orientation of the platinum.

11. The memory device of claim 1, wherein a selected one or both of the first and second core conductors comprises copper.

12. The memory device of claim 1, wherein the first and second outer claddings are made from a material selected from the group consisting of tantalum, tantalum nitride, titanium, and titanium nitride.

13. The memory device of claim 1 and further comprising:
    a non-ohmic device including a substantially planar layer of a second electrically insulating material including a second tunnel barrier,
    the second electrically insulating material is positioned between the second outer cladding and the second electrode, and the second tunnel barrier is in contact with the second electrode and a portion of the second outer cladding, and wherein the memory element and the non-ohmic device are electrically in series with the first and second cladded conductors.

14. The memory device of claim 13 and further comprising:
    a third electrode positioned between the second tunnel barrier and the second outer cladding, the third electrode in contact with the second tunnel barrier and a portion of the second outer cladding.

* * * * *